(12) United States Patent  
Okita

(10) Patent No.: US 7,593,100 B2  
(45) Date of Patent: Sep. 22, 2009

(54) MEASURING METHOD, MEASURING SYSTEM, INSPECTING METHOD, INSPECTING SYSTEM, EXPOSURE METHOD AND EXPOSURE SYSTEM, IN WHICH INFORMATION AS TO THE DEGREE OF THE FLATNESS OF AN OBJECT IS PRE-OBTAINED

(75) Inventor: Shinichi Okita, Hishi Tokyo (JP)

(73) Assignee: Nikon Corporation, Tokyo (JP)

( * ) Notice: Subject to any disclaimer, the term of this patent is extended or adjusted under 35 U.S.C. 154(b) by 344 days.

(21) Appl. No.: 11/336,761

(22) Filed: Jan. 23, 2006

(65) Prior Publication Data

US 2006/0203232 A1 Sep. 14, 2006

Related U.S. Application Data

(60) Provisional application No. 60/717,330, filed on Sep. 15, 2005.

(30) Foreign Application Priority Data

Jan. 24, 2005 (JP) .............................. 2005-015464

(51) Int. Cl.  
*G01N 21/00* (2006.01)  
*G01B 11/00* (2006.01)

(52) U.S. Cl. .................................... 356/237.5; 356/511

(58) Field of Classification Search ................. 356/511, 356/512, 503, 237.3, 237.4, 504, 630, 237.5, 356/489, 495  
See application file for complete search history.

(56) References Cited

U.S. PATENT DOCUMENTS

| 5,795,685 | A | 8/1998 | Liebmann et al. |
| 6,319,637 | B1 | 11/2001 | Higashikawa et al. |
| 2002/0102749 | A1* | 8/2002 | Fielden et al. ................. 438/14 |
| 2004/0227916 | A1 | 11/2004 | Kono et al. |

FOREIGN PATENT DOCUMENTS

| JP | A 09-260245 | 10/1997 |
| JP | A 10-002865 | 1/1998 |
| JP | A 10-207040 | 8/1998 |
| JP | A 2000-221662 | 8/2000 |
| JP | A 2001-023886 | 1/2001 |
| JP | A 2002-057097 | 2/2002 |
| JP | A 2003-142370 | 5/2003 |
| JP | A 2004-165249 | 6/2004 |
| JP | A 2004-296939 | 10/2004 |
| JP | A 2004-327485 | 11/2004 |

* cited by examiner

*Primary Examiner*—Patrick J Connolly  
(74) *Attorney, Agent, or Firm*—Oliff & Berridge, PLC

(57) ABSTRACT

A reticle is loaded on a reticle measuring instrument (step S50), and the surface shape of the reticle in a state held by a reticle holder of the reticle measuring instrument is measured in advance (step S52). Because the surface shape difference between the reticle holder of the reticle measuring instrument and a reticle holder of an exposure apparatus is known, the surface shape of the reticle in a state equivalent to the state held by the reticle holder of the exposure apparatus can be calculated (step S56) by adding to the measurement results such surface shape difference.

32 Claims, 17 Drawing Sheets

DEGREE OF FLATNESS OF RETICLE

MEASURING METHOD, MEASURING SYSTEM, INSPECTING METHOD, INSPECTING SYSTEM, EXPOSURE METHOD AND EXPOSURE SYSTEM, IN WHICH INFORMATION AS TO THE DEGREE OF THE FLATNESS OF AN OBJECT IS PRE-OBTAINED

CROSS-REFERENCE

This non-provisional application claims the benefit of Provisional Application No. 60/717,330 filed Sep. 15, 2005, the disclosure of which is hereby incorporated herein by reference in its entirety.

BACKGROUND OF THE INVENTION

1. Field of the Invention

The present invention relates to measuring methods, measuring systems, inspecting methods, inspection systems, exposure methods and exposure systems, and more particularly to a measuring method and a system in which information related to the degree of flatness of an object used for exposure is measured, an inspecting method and a system in which an object used for exposure is inspected for foreign materials or partial defects, and an exposure method and an exposure system using the measuring method and the inspecting method.

2. Description of the Related Art

In a lithography process for manufacturing semiconductor devices, liquid crystal display devices, and the like, an exposure apparatus that transfers a pattern formed on a mask or a reticle (hereinafter generally referred to as a 'reticle') onto a substrate such as a wafer, a glass plate, or the like on which a resist or the like is coated (hereinafter generally referred to as a 'wafer') via a projection optical system, as in for example, a sequentially moving type exposure apparatus such as a reduction projection exposure apparatus by the step-and-repeat method (the so-called stepper), or a scanning projection exposure apparatus by the step-and-scan method (the so-called scanning stepper), which is an improvement of the stepper, is mainly used.

In the projection optical system of such types of projection exposure apparatus, because resolution close to the limit is required, in recent years, the numerical aperture (NA) of the projection optical system is largely set so as to improve the resolution, which makes the depth of focus (DOF) fairly shallow. As a consequence, this tightens the requirement accuracy of focus leveling control in which the exposure surface of the wafer is positioned within the depth of focus in the direction of the optical axis of the projection optical system.

In such a situation, even a slight deformation of the reticle cannot be overlooked. For example, when the target position of the wafer in the direction of the optical axis of the projection optical system is arranged at the same position for the entire pattern area, if, in the case the surface (pattern surface) of the pattern area of the reticle is uniformly bent to the projection optical system side, then the exposure surface will fall outside the depth of focus and defocus will occur partially.

Further, when deformation of the pattern surface occurs in the reticle, the image-forming position of the pattern on the pattern surface in the direction perpendicular to the optical axis of the projection optical system may also change (lateral deviation), and such lateral deviation of the pattern may also be the cause of distortion errors.

From the background described above, requirements are pressing for a more accurate control in the degree of flatness of the reticle. For example, one example is the art of devising holding methods of the reticle in a reticle holder (for example, Kokai (Japanese Unexamined Patent Application Publication) No. 2004-328014)). Further, a standard is rigidly set, which is related to the degree of flatness of the reticle according to the transfer accuracy of the pattern required, and as its qualifying standard, for example, the degree of flatness, which is expressed as the difference between the maximum value and the minimum value of the reticle surface, is to be within 0.5 micron.

This standard, however, is a standard that is related to the degree of flatness of the reticle itself, and during the actual exposure, the degree of flatness further decreases due to the following reasons:

(a) flexure due to the weight of the reticle itself, (b) reticle deformation that occurs when the reticle is forcibly held by suction by the reticle holder (platen) due to different degree of flatness of the contact surface of both the reticle and the reticle holder.

Because the deformation of the reticle held by the reticle holder is different in each reticle, or further different in each reticle holder in the exposure apparatus (substantially synonymous with each equipment), in order to obtain information related to the degree of flatness of the reticle on exposure, there is no way but to measure the reticle used in exposure in a state where the reticle is actually held by suction by the reticle holder of the exposure apparatus. In this case, however, because the process of measuring the deformation of the reticle after the reticle is held on the reticle holder will have to be performed during the series of exposure processes, concern of the throughput declining in the exposure process arises.

SUMMARY OF THE INVENTION

The present invention has been made in consideration of the circumstances described above, and according to the first aspect of the present invention, there is provided a measuring method, the method comprising: a pre-obtaining process in which before carrying an object held by a predetermined holding unit into an exposure apparatus that performs exposure using the object, information related to the degree of flatness of the object in a state held by the predetermined holding unit or in a state equivalent to the state held by the predetermined holding unit is obtained.

In this case, 'a state equivalent to the state held by the predetermined holding unit' includes not only the state where the object is not in a state held by the predetermined holding unit and in a state held by a holding unit that can hold the object in a substantially equivalent holding state as the predetermined holding unit, but also a state where by obtaining information related to the degree of flatness of the object in such a state, information on the degree of flatness of the object in a state held by the predetermined holding unit can be computed or estimated. Further, in this case, 'information related to the degree of flatness' is information that is useful when computing the degree of flatness of the object surface, and for example, the surface shape data of the object can be given as a representative example.

According to this method, because information related to the degree of flatness of the object in the state held by the predetermined holding unit or in the state equivalent to the state held by the predetermined holding unit is obtained before the object used for exposure is carried into the exposure apparatus, information on the degree of flatness of the object can be acknowledged prior to exposure without affecting the throughput of the exposure apparatus.

According to the second aspect of the present invention, there is provided a first exposure method in which a pattern formed on a mask is transferred onto a photosensitive object via a projection optical system, the exposure method comprising: a measuring process in which information related to the degree of flatness of at least one of the mask and the photosensitive object is measured using the measuring method in the present invention; and a transfer process in which the pattern is transferred onto the photosensitive object while performing at least one of correcting the image-forming characteristics of the projection optical system and correcting the relative position between the mask and the photosensitive object, based on results of the measurement. In such a case, because information related to the degree of flatness of the mask or the photosensitive object used in exposure is measured using the measuring method in the present invention, exposure with high accuracy can be achieved without decreasing the throughput.

According to the third aspect of the present invention, there is provided a second exposure method in which an object held by a predetermined holding unit is used when performing exposure, the exposure method comprising: an adjustment process in which the holding state of the object is adjusted so that the degree of flatness of the object in a state held by the predetermined holding unit is favorable; and an exposure process in which exposure is performed while the object is held by the predetermined holding unit in the adjusted holding state. In such a case, because the object can be held by a holding unit whose holding state has been adjusted so that the degree of flatness of the object becomes favorable when exposure using the object held by the predetermined holding unit is performed, exposure with high accuracy can be achieved.

According to the fourth aspect of the present invention, there is provided an inspecting method, the method comprising: a pre-obtaining process in which before carrying an object into an exposure apparatus that uses the object for exposure, information related to at least one of foreign particles adhered on the object and defects of a part of the object is obtained. According to this method, because information related to at least one of foreign particles adhered on the object and defects of a part of the object is obtained before the object used for exposure is carried into the exposure apparatus, information related to at least one of foreign particles adhered on the object and defects of a part of the object can be acknowledged at an early timing, without affecting the throughput of the exposure apparatus.

According to the fifth aspect of the present invention, there is provided a third exposure method in which a pattern formed on a mask is transferred onto a photosensitive object via a projection optical system, the exposure method comprising: a pre-processing process in which pre-processing to foreign particle adhesion or partial defect of at least one of the mask and the photosensitive object is performed using the inspecting method in the present invention; and a transfer process in which the pattern is transferred onto the photosensitive object based on results of the pre-processing process. In such a case, because foreign particles adhesion or defects in a part of the mask or the photosensitive object is detected before carrying the mask or the photosensitive object into the exposure apparatus, and exposure is performed based on the detection results, decrease in yield due to foreign particles adhesion or partial defects can be prevented.

According to the sixth aspect of the present invention, there is provided a first exposure system, the system comprising: an exposure apparatus that performs exposure using an object held by a predetermined holding unit; and a pre-obtaining unit that obtains information related to the degree of flatness of the object in a state held by the predetermined holding unit or in a state equivalent to the state held by the predetermined holding unit is obtained before carrying the object into the exposure apparatus. According to the system, information related to the degree of flatness of the object in a state held by the predetermined holding unit or in a state equivalent to the state held by the predetermined holding unit is obtained before carrying the object used for exposure into the exposure apparatus. By this operation, information on the degree of flatness of the object can be acknowledged prior to exposure without affecting the throughput of the exposure apparatus.

According to the seventh aspect of the present invention, there is provided a second exposure system, the system comprising: an exposure apparatus that performs exposure using an object; and a pre-obtaining unit that obtains information related to at least one of foreign particles adhered on the object and defects of a part of the object, before carrying the object into the exposure apparatus. In such a case, information related to at least one of foreign particles adhered on the object used for exposure and defects of a part of the object can be obtained using the pre-obtaining unit, before the object is carried into the exposure apparatus.

DETAILED DESCRIPTION OF THE EMBODIMENTS

A First Embodiment

Figure 1:
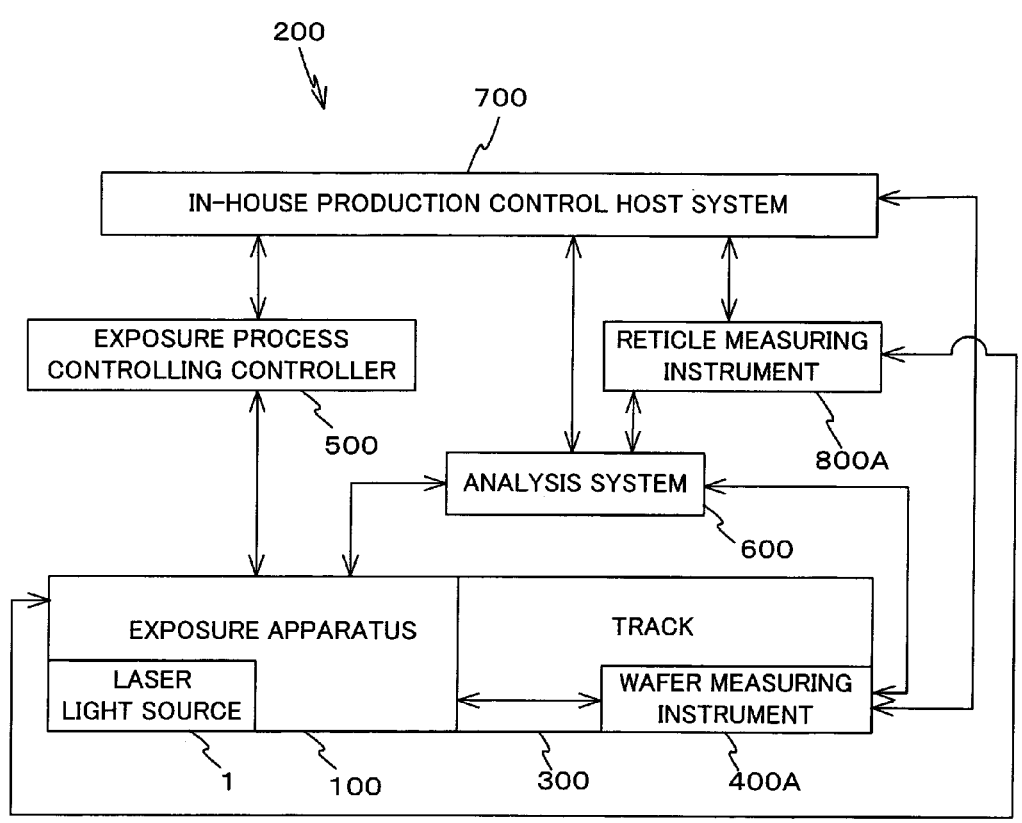
FIG. 1 is a view showing a schematic arrangement of an exposure system related to a first embodiment of the present invention.

A first embodiment of the present invention will be described below, with reference to FIGS. 1 to 14. FIG. 1 shows an entire configuration of an exposure system 200 that can suitably perform the measuring method and exposure method related to the present invention.

Exposure system 200 is installed in a 'substrate processing factory' where devices such as microdevices or the like are manufactured by processing substrates serving as a photosensitive object such as a semiconductor wafer or a glass plate (hereinafter, generally referred to as a 'wafer'). As is shown in FIG. 1, exposure system 200 is equipped with an exposure apparatus 100 that has a laser light source 1 or the like, a coating/developing unit (hereinafter referred to as 'track') 300, and a reticle measuring instrument 800A that measures the shape of the surface of the reticle. Inside track 300, a wafer measuring instrument 400A is installed.

The combination of exposure apparatus 100 and track 300 can be considered a unit, and can be integrally regarded as a 'substrate processing unit'. The substrate processing unit performs the following processes, cooperating with other units in exposure system 200 if necessary: a coating process in which a photosensitive agent such as a photoresist is coated on a wafer, and a pre-obtaining process in which information related to the degree of flatness of the wafer (the shape of the surface) is obtained in advance; an exposure process in which a pattern formed on a reticle is transferred onto the wafer coated with the photosensitive agent, and a development process in which the wafer that has undergone the exposure process is developed, and the like. Of such processes, the coating process and the development process is performed by track 300, the exposure process is performed by exposure apparatus 100, and the pre-obtaining process is performed by track 300 and an analysis system 600, which will be described later in the description. The pre-obtaining process of the shape of the surface of the reticle is performed by reticle measuring instrument 800A and analysis system 600, which will be described later.

In the substrate processing unit, exposure apparatus 100 and track 300 have a reciprocal in-line connection. In-line connection in this case, refers to a connection between the two units as well as a connection between the processing units inside each unit via a carrier unit that automatically carries the wafer such as a robot arm, a slider, or the like.

In FIG. 1, for the sake of the page surface, only one substrate processing unit is shown, however, in actual, exposure system 200 has a plurality of substrate processing units installed. That is, in exposure system 200, a plurality of substrate processing units, or exposure apparatus 100 and tracks 300 in-line connected to exposure apparatus 100, is installed.

Furthermore, exposure system 200 has an exposure process controlling controller 500 that intensively controls the exposure processes performed by each exposure apparatus 100, analysis system 600 that performs various calculation processing and analysis processing, and an in-house production control host system 700.

Of each unit that constitutes exposure system 200, at least both substrate processing units (100 and 300), and reticle measuring instrument 800A is installed in a clean room where the temperature and the humidity is controlled. Further, each unit connects via a network or a dedicated line (wired or wireless) such as a LAN (Local Area Network) installed within the substrate processing factory, and data communication is possible between the units.

Wafer measuring instrument 400A is a unit that operates independently from exposure apparatus 100, and the unit is installed as one of a plurality of processing units arranged inside track 300, as it will be described later. Wafer measuring instrument 400A measures the shape of the surface of the wafer subject to exposure in advance, before the wafer is carried into exposure apparatus 100. Further, reticle measuring instrument 800A is a measuring unit that operates independently from other units (such as the substrate processing units (100 and 300), and the like), and in exposure system 200, reticle measuring instrument 800A is arranged alone or in a plurality of numbers.

Exposure Apparatus

Figure 2:
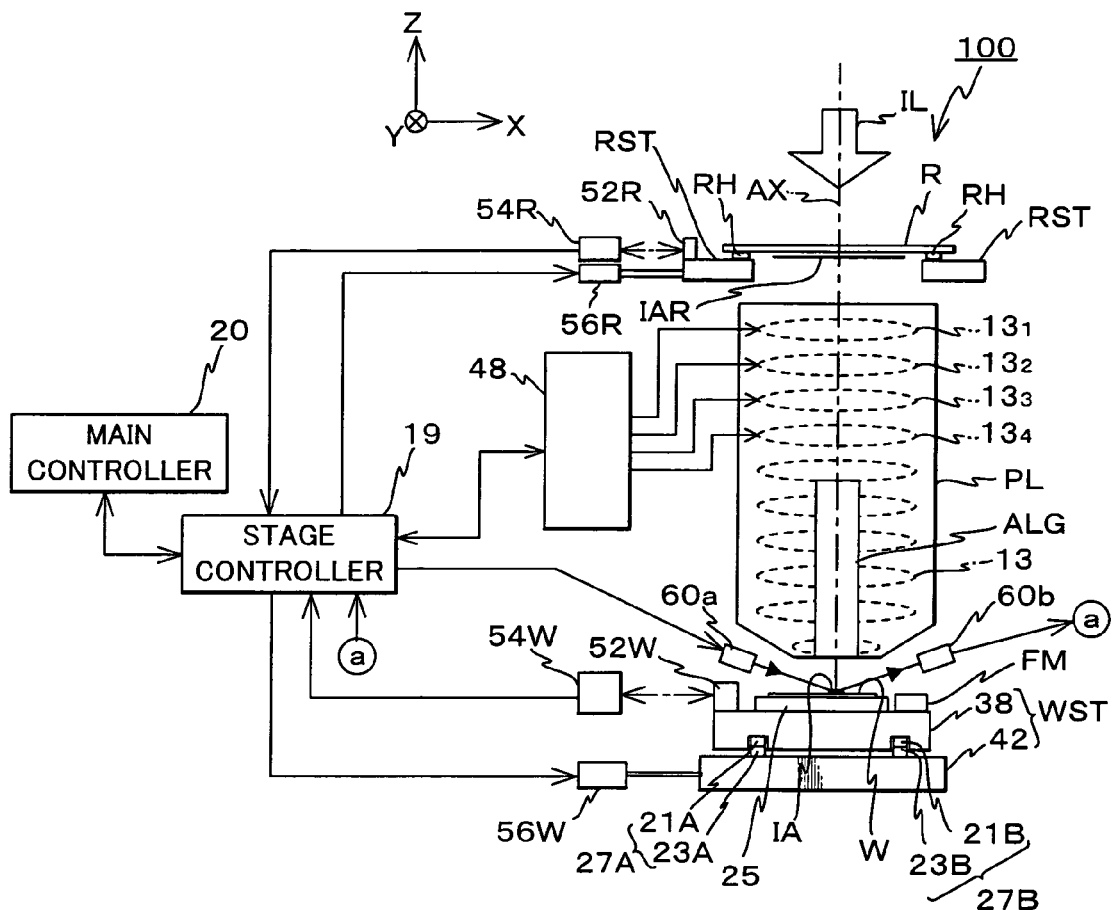
FIG. 2 is a view showing a schematic arrangement of an exposure apparatus related to the first embodiment of the present invention.

In the first embodiment, exposure apparatus 100 is to be a projection exposure apparatus (scanning exposure apparatus) by the step-and-scan method. FIG. 2 shows a model of a schematic configuration of exposure apparatus 100. As is shown in FIG. 2, exposure apparatus 100 has an illumination system that includes laser light source 1 shown in FIG. 1 and an illumination optical system (not shown), a reticle stage RST that holds reticle R illuminated by an exposure illumination light (hereinafter shortened to 'illumination light') serving as an energy beam from the illumination system, a projection optical system PL, a wafer stage WST on which wafer W carried in is mounted, a control system that controls these parts, and the like.

Reticle stage RST is finely drivable (including rotation around a Z-axis) within an XY plane perpendicular to the optical axis (coincides with an optical axis AX of projection optical system PL, which will be described later) of the illumination system by a reticle stage drive section 56R including, for example, a linear motor or the like, and also is drivable at a designated scanning speed in a predetermined scanning direction (in this case, a Y-axis direction).

Figure 3A:
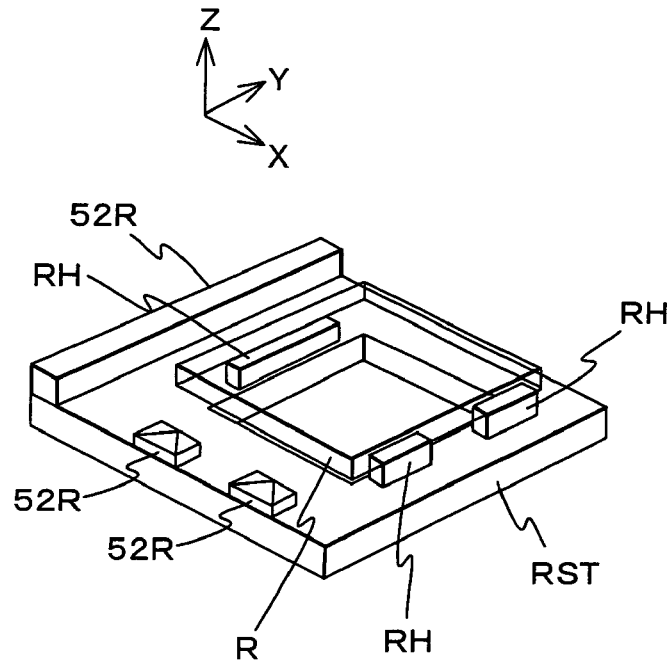
FIG. 3A is a perspective view showing an arrangement of a reticle holder.

On reticle stage RST, a reticle holder RH is arranged. Reticle holder RH holds reticle R by suction, such as for example, vacuum chucking, so that the surface on the pattern area side (hereinafter referred to as 'pattern surface') faces the –Z side. As is shown in the perspective view in FIG. 3A, reticle holder RH has three suction surfaces that extend in the Y-axis direction for holding reticle R on both ends in an X-axis direction. In each of the three suction surfaces, a platen section that comes into contact with reticle R and a groove section that communicates with the vacuum source via piping are arranged. FIG. 3A does not show both sections. When holding reticle R by suction, reticle R supported by the platen section cuts off the outside air of the groove section so that the groove section moves into a vacuum state, and reticle R is held by suction by the outside pressure force. Accordingly, the suction force to reticle R corresponds to the degree of vacuum of the groove section. In exposure apparatus 100, by adjusting the exhaustion force by the vacuum source (not shown) under the instructions of a main controller 20, the suction force to reticle R can be controlled.

Referring back to FIG. 2, in reticle stage RST, an opening that is a passage hole of illumination light IL is formed below reticle R. The size of the opening is set to be slightly larger than an illumination area IAR.

On reticle stage RST, a movable mirror 52R that reflects the laser beam from a reticle laser interferometer (hereinafter referred to as 'reticle interferometer') 54R is fixed, and the position of reticle stage RST within the XY plane is constantly detected by reticle interferometer 54R at a resolution of, for example, around 0.5 to 1 nm. In actual, as is shown in FIG. 3A, on reticle stage RST, a movable mirror is arranged that has a reflection surface orthogonal to the non-scanning direction (the X-axis direction) on scanning exposure, and for the scanning direction (the Y-axis direction) of reticle stage RST, two corner cube mirrors (such as retroreflectors) are arranged. Also, interferometers are arranged that have measurement axes corresponding to the mirrors, however, in FIG. 2, these are representatively shown as movable mirror 52R and reticle interferometer 54R. That is, as for the Y-axis direction, reticle interferometer 54R is a dual-axis interferometer that has two measurement axes, and based on the measurement values of reticle interferometer 54R, the rotation around the Z-axis (a θz rotation) can also be measured, in addition to the Y position of reticle stage RST. Incidentally, for example, the edge surface of reticle stage RST may be polished in order to form a reflection surface (corresponds to the reflection surface of movable mirror 52R).

The positional information on reticle stage RST from reticle interferometer 54R is sent to a stage controller 19, and also to main controller 20 via stage controller 19. Stage controller 19 controls the movement of reticle stage RST via reticle stage drive section 56R, in response to instructions from main controller 20.

Although it is not shown in FIG. 2, in reticle stage RST, a reticle fiducial mark plate (hereinafter shortened to as 'reticle mark plate') consisting of a glass substrate whose degree of flatness on the lower side (−Z side) is good is arranged. The reticle mark plate is made of the same glass material as reticle R, such as, for example, synthetic quartz, fluorite, potassium fluoride, or other fluoride crystals, and is fixed to reticle stage RST. The standard datum plane of the reticle mark plate is set designwise so that the standard datum plane is at the same height as the pattern surface and is substantially the same size as the slit-shaped illumination area IAR described earlier. The standard datum plane has a high degree of flatness, and a plurality of evaluation marks are arranged evenly (for example, in a matrix shape) on the entire surface of the standard datum plane. When the reticle mark plate is positioned above optical axis AX of projection optical system PL by moving reticle stage RST, the images of the plurality of evaluation marks obtained via projection optical system PL can be formed on the side of wafer stage WST. The image-forming plane consisting of the images of the plurality of evaluation marks can be regarded as the projection image plane of the standard datum plane of reticle mark plate. In the first embodiment, the projection image plane will be the standard datum image plane when focus/leveling control of wafer stage WST is performed.

Projection optical system PL is arranged below reticle stage RST in FIG. 2 so that the direction of its optical axis AX matches the Z-axis direction. Projection optical system is a both-side telecentric reduction system, and a dioptric system is used, consisting of a plurality of lens elements that are arranged at a predetermined interval along the direction of optical axis AX. The projection magnification of projection optical system PL is, for example, ¼, ⅕, or the like. Therefore, when illumination light IL from the illumination system (not shown) illuminates the slit-shaped illumination area on IAR reticle R, illumination light IL that has passed through reticle R forms a reduced image (a partial reduced image) of the circuit pattern of reticle R within illumination area IAR on wafer W whose surface is coated with a resist (photosensitive agent), on an exposure area IA conjugate with illumination area IAR, via projection optical system PL.

As projection optical system PL, a refracting system is used composed only of a plurality of dioptric elements (lens elements) 13, such as around 10 to 20. Of the plurality of lens elements 13 making up projection optical system PL, a plurality of lens elements $13_1$, $13_2$, $13_3$, and $13_4$ (in this case, for the sake of simplicity, four lens elements are used) on the object-plane side (reticle R side) are movable lenses, which can be driven externally by an image-forming characteristics correction controller 48. The barrel of projection optical system PL holds lens elements $13_1$ to $13_4$ via lens holders (not shown) having a double-structure, respectively. Interior lens holders hold lens elements $13_1$ to $13_4$, respectively, and these lens holders are supported with respect to the exterior lens holders in the gravitational direction at three points by driving devices such as piezo elements (not shown). And, by independently adjusting the applied voltage to the driving devices, lens elements $13_1$ to $13_4$ can be shifted in the Z-axis direction, which is the optical axis direction of projection optical system PL, and can be driven (tilted) in a direction of inclination relative to the XY plane (that is, a rotational direction around the X-axis (θx direction) and a rotational direction around the Y-axis (θy direction)).

Other lens elements 13 are held by the barrel, via typical lens holders. Projection optical system PL may also be structured so that not only lens elements $13_1$ to $13_4$, but also the lens elements disposed near the pupil plane or the image plane side of projection optical system PL, or an aberration correcting plate (optical plate) for correcting the aberration of projection optical system PL, especially the non-rotational symmetric component, are drivable. Furthermore, the degree of freedom (the number of movable directions) of such movable optical elements is not limited to three, but may be one, two or four and over.

The drive voltage (the drive amount of the drive elements) of each drive element is controlled by image-forming characteristics correction controller 48 according to instructions from main controller 20, and by the control, it becomes possible to correct the image-forming characteristics of projection optical system PL such as focus, curvature of field, distortion, magnification, spherical aberration, astigmatism, coma, and the like.

Wafer stage WST is configured including an XY stage 42, and a Z-tilt stage 38 mounted on XY stage 42.

XY stage 42 is supported by levitation above the upper surface of a wafer stage base (not shown) arranged in the operating range of wafer stage WST by air bearings (not shown) via a clearance of, for example, around several μm. XY stage is configured drivable two dimensionally, in the Y-axis direction (the orthogonal direction of the page surface in FIG. 2) serving as the scanning direction and in the X-axis direction (the lateral direction of the page surface in FIG. 2) orthogonal to the Y-axis direction, by linear motors or the like (not shown) constituting a wafer stage drive section 56W.

Z-tilt stage 38 is supported on XY stage at three points by three Z drive sections 27A, 27B, and 27C (however, Z drive section 27C in the depth of the page surface is not shown). These Z drive sections 27A, 27B, and 27C are structured including three actuators (such as voice coil motors or the like) 21A, 21B, and 21C (however, actuator 21C in the depth of the page surface is not shown) that are driven independently in the optical axis direction (Z-axis direction) of projection optical system PL at the respective supporting points at the lower surface of Z-tilt stage 38, and encoders 23A to 23C (however, encoder 23C in the depth of the page surface is not shown) that detect the drive amount (displacement from the datum position) in the Z-axis direction at each supporting point by actuators 21A, 21B, and 21C, respectively. As encoders 23A to 23C, for example, an optical linear encoder or an electrostatic capacitance linear encoder can be used.

In the first embodiment, actuators 21A to 21C constitute a drive unit that drives Z-tilt stage 38 in the direction of optical axis AX (the Z-axis direction) and the direction of inclination with respect to a surface orthogonal to the optical axis (the XY plane), or in other words, the θx direction, which is the rotational direction around the X-axis, and the θy direction, which is the rotational direction around the Y-axis. Further, the drive amount (the displacement amount from the datum point) in the Z-axis direction at each supporting point by Z drive sections 27A to 27C of Z-tilt stage 38 measured with encoders 23A to 23C is supplied to stage controller 19, and to main controller 20 via stage controller 19.

On Z-tilt stage 38, a movable mirror 52W is fixed, and with a wafer laser interferometer (hereinafter referred to as 'wafer interferometer') 54W externally arranged, the position of Z-tilt stage 38 within the XY plane is constantly detected at a resolution of, for example, around 0.5 to 1 nm, via movable mirror 52W.

In actual, a Y movable mirror that has a reflection surface orthogonal to the scanning direction on scanning exposure, which is the Y-axis direction, and an X movable mirror that has a reflection surface orthogonal to the non-scanning direction, which is the X-axis direction, are arranged on Z-tilt stage 38. And corresponding to the mirrors, an X laser interferometer for measuring the position in the X-axis direction and a Y laser interferometer for measuring the position in the Y-axis direction interferometers are also arranged. In FIG. 2, however, these are representatively shown as movable mirror 52W and wafer interferometer 54W. Incidentally, for example, the edge surface of Z-tilt stage 38 may be polished in order to form a reflection surface (corresponds to the reflection surface of the X movable mirror and Y movable mirror). Further, the X laser interferometer and the Y laser interferometer are both multi-axis interferometers that have a plurality of measurement axes, and with these interferometers, other than the X and Y positions of wafer stage WST, rotation (yawing (θz rotation, which is rotation around the Z-axis), pitching (θx rotation, which is rotation around the X-axis), and rolling (θy rotation, which is rotation around the Y-axis) can also be measured. Accordingly, in the description below, wafer interferometer 54W is to measure the X, Y, θz, θy, and θx positions of Z-tilt stage 38, in directions of five degrees of freedom. In addition, the multi-axis interferometers may detect positional information related to the optical axis direction (the Z-axis direction) of projection optical system PL, by irradiating a laser beam on a reflection surface provided on the frame on which projection optical system PL is mounted (not shown), via a reflection surface arranged on Z tilt stage 38 at an inclination of 45°.

The positional information (and velocity information) on wafer stage WST is sent to stage controller 19, and also to main controller 20 via stage controller 19. Stage controller 19 controls the position of wafer stage WST within the XY plane via wafer stage drive section 56W, in response to instructions from main controller 20, as well as control the Z position and inclination of Z-tilt stage 38 by driving Z drive sections 27A to 27C.

Figure 3B:
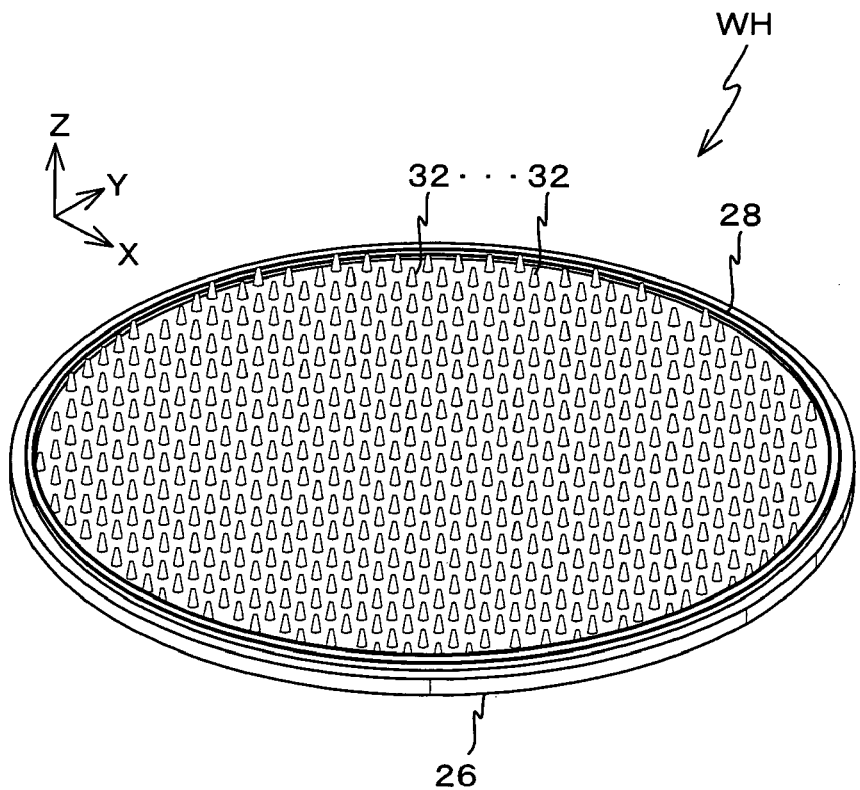
FIG. 3B is a perspective view showing an arrangement of a wafer holder.

On Z-tilt stage 38, a wafer holder WH is arranged, and wafer W is vacuum chucked on wafer holder WH. As is shown in FIG. 3B, wafer holder WH has a circular plate-shaped main body section 26 that has an appearance of a predetermined thickness, a plurality of protruding pins, that is, pin sections 32, arranged at a predetermined interval in an area of a predetermined size in the center section excluding the ring-shaped area of a predetermined width in the vicinity of the outer circumference section on the upper surface of main body section 26 (the surface in front of the page surface in FIG. 2), a ring-shaped protruding section (hereinafter referred to as 'rim section') 28 arranged in the vicinity of the outer circumference edge in a state enclosing the area in which the plurality of pin sections 32 is arranged, and the like. The area where pin sections 32 are arranged communicates with the vacuum source via piping, and when wafer W is mounted, the area moves into a vacuum state, and wafer W is held by suction in a state supported by pins 32 and the like.

Referring back to FIG. 2, further on wafer stage WST, a fiducial mark plate FM on which marks such as a first fiducial mark in a plurality of pairs for reticle alignment, fiducial marks used for baseline measurement of an alignment system ALG, and the like are formed, is fixed so that the surface of the fiducial mark plate is substantially at the same height as the surface of wafer W. On fiducial mark plate FM, a projected image of the standard datum plane of the reticle mark plate previously described, and a mirror-polished flat surface large enough to cover the measurement point areas of the focal point position detection system, which will be described later, are arranged. The height of the flat surface is also set so that it is the same height as the surface of wafer W.

In exposure apparatus 100 of the first embodiment, a multiple focal point position detection system (hereinafter simply referred to as a 'focal point position detection system') of an oblique incident method is arranged, consisting of an irradiation system 60a and a light-receiving system 60b. Irradiation system 60a has a light source whose on/off is controlled by main controller 20, and the system irradiates image-forming beams toward the image-forming plane of projection optical system PL for making multiple pinhole or slit images from an oblique direction with respect to optical axis AX, while light-receiving system 60b receives the reflection beams of such image-forming beams at the surface of wafer W. The points where the multiple slit images are formed are to be the measurement points of the focal point position detection system (60a, 60b), and the area consisting of the measurement points will also be referred to below as a 'measurement point area'. The measurement point area is arranged corresponding to exposure area IA and its neighboring area. That is, at the plurality of measurement points of the focal point position detection system (60a, 60b), the position (height) of wafer W in the Z-axis direction can be detected at each point, and it is possible to obtain the Z position of the surface of wafer W at exposure area IA and its neighboring area, or in other words, the inclination, from the surface position of wafer W at all the measurement points according to the measurement results of the plurality of measurement points.

Details on the configuration of a multiple focal point position detection system similar to the focal point position detection system (60a, 60b) in the first embodiment are disclosed in, for example, Kokai (Japanese Unexamined Patent Application Publication) No. 6-283403 (corresponding U.S. Pat. No. 5,448,332) and the like. As long as the national laws in designated states (or elected states), to which this international application is applied, permit, the above disclosures of the publication and the U.S. Patent are incorporated herein by reference. The multiple focal point position detection system according to the above publication and the like can measure not only exposure IA on wafer W but also the Z position of its neighboring area, as in the earlier description, and also has a function such as pre-reading the unevenness of wafer W in the scanning direction, however, the system does not have to have such functions. Further, the shape of the beams irradiated by irradiation system 60a can be a parallelogram or other shapes as well.

On scanning exposure and the like, stage controller 19 performs auto-focusing (automatic focusing) and auto-leveling by controlling the Z-position and the inclination with respect to the XY plane of wafer W so as to eliminate defocus or to make the defocus fall within the depth of focus via wafer stage drive section 56, based on defocus signals from light-receiving system 60b, such as S-curve signals.

Furthermore, exposure apparatus 100 is equipped with alignment system ALG by an off-axis method, which is used for positional measurement and the like of alignment marks on wafer W held on wafer stage WST (or to be more precise, wafer holder WH) and fiducial marks formed on fiducial mark plate FM. As alignment system ALG, for example, a sensor of an FIA (Field Image Alignment) system based on an image-processing method is used. This sensor irradiates a broadband detection beam that does not expose the resist on the wafer on a target mark, picks up an image of the target mark formed on the photodetection surface by the reflection light from the target mark and an index image with a pick-up device (such as a CCD), and outputs the imaging signals. Details on the FIA system sensor is disclosed in, for example, Kokai (Japanese Unexamined Patent Application Publication) No. 2-54103 (corresponding U.S. Pat. No. 4,962,318) and the like. As long as the national laws in designated states (or elected states), to which this international application is applied, permit, the above disclosures of the publication and the U.S. Patent are incorporated herein by reference. The sensor, however, is not limited to the FIA system sensor, and it is a matter of course that an alignment sensor that irradiates a coherent detection light on a target mark and detects the scattered light or diffracted light generated from the target mark, or a sensor that detects two diffracted lights (for example, the same order) generated from a target mark that are made to interfere can be used independently, or appropriately combined.

Furthermore, in exposure apparatus 100 of the first embodiment, although it is omitted in the drawings, a pair of reticle alignment systems is arranged above reticle R, each constituted by a TTR (Through The Reticle) alignment optical system. With this system, the light of the exposure wavelength is used to observe a pair of reticle marks on reticle R and the pair of the first fiducial marks corresponding to the reticle marks on the fiducial mark plate at the same time, via projection optical system PL. In the embodiment, as alignment system ALG and the reticle alignment system, systems that have a structure similar to the ones disclosed in, for example, Kokai (Japanese Unexamined Patent Application Publication) No. 7-176468 (corresponding U.S. Pat. No. 5,646,413) and the like are used. As long as the national laws in designated states (or elected states), to which this international application is applied, permit, the above disclosures of the publication and the U.S. Patent are incorporated herein by reference.

The control system in FIG. 2 is mainly composed of main controller 20. Main controller 20 is constituted by a so-called workstation (or microcomputer) made up of a CPU (Central Processing Unit), ROM (Read Only Memory), RAM (Random Access Memory), and the like, and besides the various control operations described above, main controller 20 controls the overall operation of the entire apparatus. Stage controller 19 controls the position of wafer stage WST (XY stage 42 and Z-tilt stage 38) and reticle stage RST, according to instructions from main controller 20.

Reticle Measuring Instrument

Next, the configuration of reticle measuring instrument 800A will be described, referring to FIG. 4. Reticle measuring instrument 800A has a reticle stage RST' corresponding to reticle stage RST in exposure apparatus 100, and a reticle holder RH', which is the same type of holder as reticle holder RH, and a Fizeau interferometer 60.

Reticle measuring instrument 800A is installed on a carrier path of a reticle carrier system (not shown) for carrying reticle R in exposure system 200. In exposure system 200, for example, before reticle R is loaded into exposure apparatus 100, reticle R is loaded into reticle measuring instrument 800A by a reticle carrier system (not shown) and is held by vacuum suction at an appropriate vacuum pressure on reticle holder RH', under the control of exposure process controlling controller 500. Reticle measuring instrument 800A measures the surface shape of the pattern surface of reticle R in a state where reticle R is held by suction on reticle holder RH'.

At this point, reticle R is to be held so that the pattern surface faces the −Z side. And, in reticle measuring instrument 800A, in order to make the measurement of the surface shape of the pattern surface of reticle R possible, Fizeau interferometer 60 is arranged on the −Z side of reticle holder RH', or in other words, on the pattern surface side of reticle R held on reticle holder RH'.

Fizeau interferometer 60 is configured including a laser light source 61, a lens 62, a stop 63, a beam splitter 64, a λ/4 wavelength plate 65, a collimator lens 66, reference plane members 67 and 68 on which reference planes 67A and 68A are formed, a lens 69, an interference fringe detection section 70, a processing unit 71, and the like.

Figure 4:
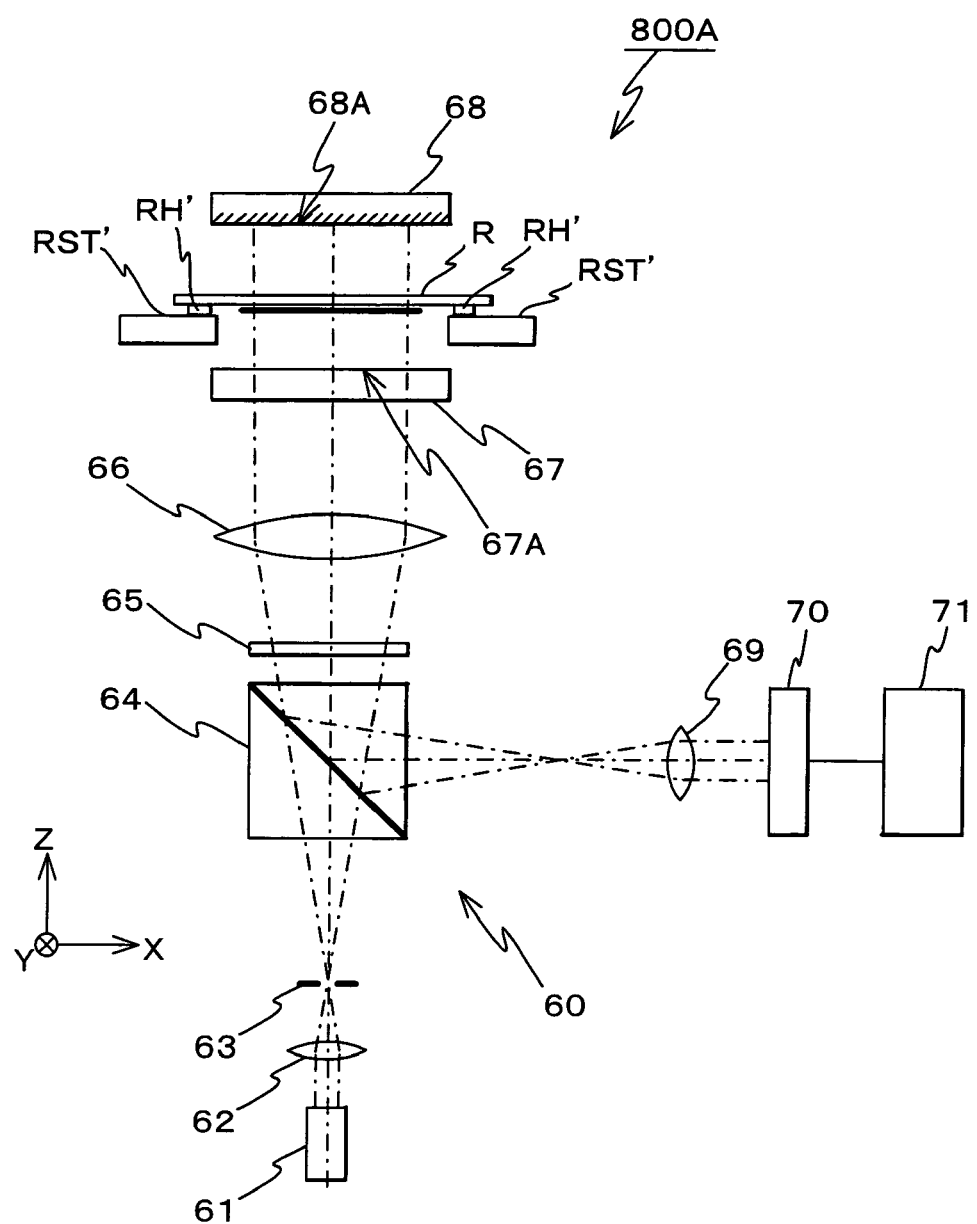
FIG. 4 is a view showing a schematic arrangement of a reticle measuring instrument related to the first embodiment of the present invention.

As is shown in FIG. 4, the light emitted from laser light source 61, such as for example, an He—Ne laser with an oscillation wavelength of 633 nm or the like, is coherent and is set to be a linear polarization beam with a polarization direction parallel to the page surface (the X-axis direction). The beam enters beam splitter 64 after passing through lens 62 and stop 63 for eliminating stray light.

Beam splitter 64 transmits the linear polarization beam having a polarization direction in the X-axis direction. The beam that has been transmitted enters λ/4 wavelength plate 65 and is converted into a circular polarized light, and then after being converted into a parallel light by collimator lens 66, the beam enters reference plane member 67. On reference plane 67A formed on reference plane member 67, a part of the parallel light is reflected, and the remaining light is transmitted. The transmitted beam is irradiated on the entire pattern surface of reticle R held on reticle holder RH', and for example, in the case chromium vapor deposition is performed on the entire surface of the pattern surface of reticle R, the parallel light irradiated is reflected off the pattern surface.

The light reflected off reference plane 67A of reference plane member 67 (reference light) and the light reflected off the pattern surface of reticle R (measuring light) are converted into a linear polarization that has a polarization direction in the Y-axis direction by λ/4 wavelength plate 65, condensed passing through collimator lens 66, and then reflected off beam splitter 64. The beam reflected off beam splitter 64 is converted into a parallel light by lens 69, and then is guided to interference fringe detection section 70 consisting of a CCD (Charge Coupled Device). On the light-receiving surface of interference fringe detection section 70, an interference fringe of a light synthesized by being reflected off both reference plane 67A of reference plane member 67 and the pattern surface of reticle R is formed, which is detected by interference fringe detection section 70.

More particularly, when the distance between reticle R and the pattern surface is expressed as d, the reference light and measuring light interfere at an optical path difference of 2 d in the case the lights move back and forth once, and when the optical path difference is an odd number multiple of half the laser wavelength, the lights negate each other and a dark line is generated, whereas when the optical path difference is an integral multiple of the laser wavelength, then the lights reinforce each other and a light line is generated. As a consequence, the interference fringe is generated on the light-receiving surface of interference fringe detection section 70.

The detection results of the interference fringe are sent to processing unit 71. Processing unit 71 calculates the surface shape of the pattern surface of reticle R held on reticle holder RH' based on the detection results of the interference fringe. To be more specific, by performing accumulation calculation on the number of light lines and dark lines of the interference fringe based on the detection results of the interference fringe, processing unit 71 tentatively decides the surface shape data corresponding to the gradient of the pattern surface of reticle R, according to the distribution state of the interference fringe. Then, with the accumulation calculation, processing unit 71 removes a certain amount of gradient and a certain amount of defocus (offset component) that the tentatively decided surface shape data contains as accumulation errors inherent in the surface shape data, and computes the final surface shape data of reticle R. The surface shape data is computed as digital data, for example, such as a surface height data (Z position) with respect to an in-surface position (XY position).

On the other hand, in the case reticle R is a transmission reticle on which chromium vapor deposition is not performed, although a part of the beam irradiated on the entire pattern surface of reticle R is reflected off the pattern area, the remaining beam reaches the surface on the opposite side of the pattern surface of reticle R, and then a part of the remaining beam is reflected off the surface while the further remaining beam transmits reticle R. The beam that has transmitted reticle R reaches the other reference plane 68A of reference plane member 68. Reference plane 68A is a surface with high reflectance, and the beam that has reached this plane is reflected and returns to reticle R. And, on the optical path similar to the one described above, an interference fringe of the reference lights respectively reflected off reference planes 67A and 68A of reference plane members 67 and 68 and the measuring lights reflected off the pattern surface or its opposite surface of reticle R is detected in interference fringe detection section 70.

As is described above, in reticle measuring instrument 800A, in the case reticle holder RH' holds a reticle on which chromium is deposited on the entire pattern surface, the interference fringe of the reference light reflected off reference plane 67A of reference plane member 67 and the measuring light reflected off the pattern surface can be observed in interference fringe detection section 70, whereas in the case reticle holder RH' holds a transmission reticle as reticle R, the interference fringe of the reference lights respectively reflected off reference planes 67A and 68A of reference plane members 67 and 68 and the measuring lights reflected off the pattern surface or its opposite surface of reticle R can be observed in interference fringe detection section 70. Accordingly, in reticle measuring instrument 800A, the surface shape of the entire pattern surface can be measured even if the reticle is a reticle on which chromium vapor deposition is performed, a transmission reticle, or a reticle on which a circuit pattern is formed in the pattern area. The measurement of the degree of flatness of the reticle does not have to be performed on the entire pattern surface, and can be approximately obtained from a plurality of measurement points on the transmission or reflection section of the reticle surface arranged evenly at a predetermined pitch in the X-axis direction and Y-axis direction. For example, the degree of flatness of the reticle can be approximately obtained from seven points in the Y-axis direction (scanning direction) and five points in the X-axis direction, from measurement values of a total of 35 measurement points within the reticle surface.

On reticle stage RST', a mark plate corresponding to the reticle mark plate is arranged as in reticle stage RST. When Fizeau interferometer 60 measures the surface shape of the pattern surface of reticle R held on reticle holder RH', the surface shape of the mark plate is also measured. That is, according to the measurement results of reticle measuring instrument 800A, the surface shape data of the pattern surface of reticle R with the surface position of the mark plate as the standard datum can be obtained.

Further, in reticle measurement instrument 800A, it is possible to improve the detection accuracy by employing a double-path type interferometer in which the laser beam passes through the body subject to detection twice as Fizeau interferometer 60.

Coating/Developing Unit

Next, track 300 equipped in each substrate processing unit will be described, referring to FIG. 5. Track 300 is arranged inside a chamber that surrounds exposure apparatus 100, so that it can be connected to exposure apparatus 100 by an in-line method. In track 300, a carrier line 301 is disposed across the center of track 300 for carrying wafer W. On one end of carrier line 301, a wafer carrier 302 in which many wafer Ws those have not yet been exposed or have been processed by the substrate processing unit in the prior process are housed and a wafer carrier 303 in which many wafer Ws that have undergone the exposure process and the development process by this substrate processing unit are arranged, and on the other end of carrier line 301, a carrier opening (not shown) with a shutter in the chamber side surface of exposure apparatus 100 is arranged.

Further, along one side of carrier line 301 installed in track 300, a coater section (coating section) 310 is installed, and along the other side, a developer section (development section) 320 is installed. Coater section 310 is configured including a resist coater that coats a photoresist on wafer W, a pre-bake unit 312 consisting of a hot plate for pre-baking the photoresist on wafer W, and a cooling unit 313 for cooling wafer W that has been pre-baked.

Developer section 320 is constituted having a post-bake unit 321 for performing the so-called PEB (Post-Exposure Bake) in which the photoresist on wafer W after exposure processing is baked, a cooling unit 322 that cools wafer W on which PEB has been performed, and a developing unit 323 that develops the photoresist on wafer W.

Wafer Measuring Instrument

Figure 6:
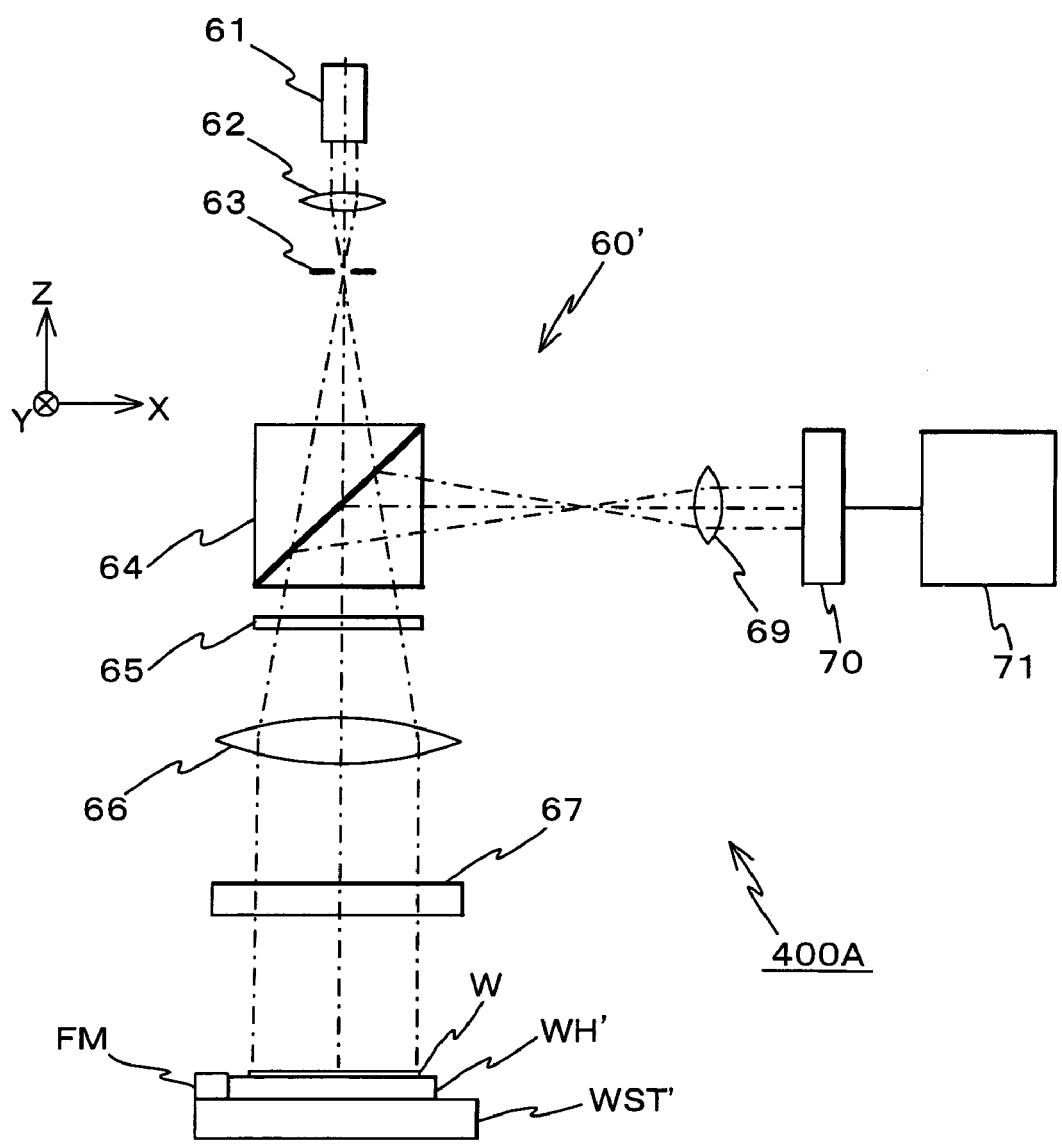
FIG. 6 is a view showing a schematic arrangement of a wafer measuring instrument related to the first embodiment of the present invention.

Further, in the first embodiment, wafer measuring instrument 400A, which measures information (surface shape) related to the degree of flatness of wafer W in advance before carrying wafer W into exposure apparatus 100, is installed in-line. Wafer measuring instrument 400A is constituted including a wafer stage WST', a wafer holder WH', and a Fizeau interferometer 60', as is shown in FIG. 6. Wafer stage WST is substantially the same type of stage as wafer stage WST, however, wafer stage WST' may be a fixed type stage that cannot be moved. Further, wafer holder WH' is a holder of the same type as wafer holder WH, and by vacuum-chucking wafer W (that is, in the same manner as in wafer holder WH in exposure apparatus 100), wafer holder WH' holds wafer W.

Similar to reticle measuring instrument 800A, wafer measuring instrument 400A measures the surface shape of wafer W in a state where wafer W is held by suction by wafer holder WH', using Fizeau interferometer 60'. Besides the point that Fizeau interferometer 60' does not have reference plane member 68, the arrangement can be the same as Fizeau interferometer 60, therefore, details on the arrangement will be omitted. That is, Fizeau interferometer 60' is a reflection measuring type interferometer.

On wafer stage WST', a mark plate corresponding to fiducial mark plate FM is arranged, as in wafer stage WST. The surface of the mark plate is strictly set as substantially flat, therefore, signals corresponding to the surface shape of the mark plate become the signals that show the height of the mark plate. Accordingly, when the signals corresponding to the surface shape of the mark plate and the signals corresponding to the surface shape of wafer W are compared, the relative relation between the height of the surface of the mark plate and the height of the surface subject to measurement on measuring the surface shape of wafer W becomes obvious, and the difference can be obtained. That is, the surface shape of wafer W held by wafer holder WH' can be measured by Fizeau interferometer 60', with the surface of the mark plate serving as the standard datum.

Figure 5:
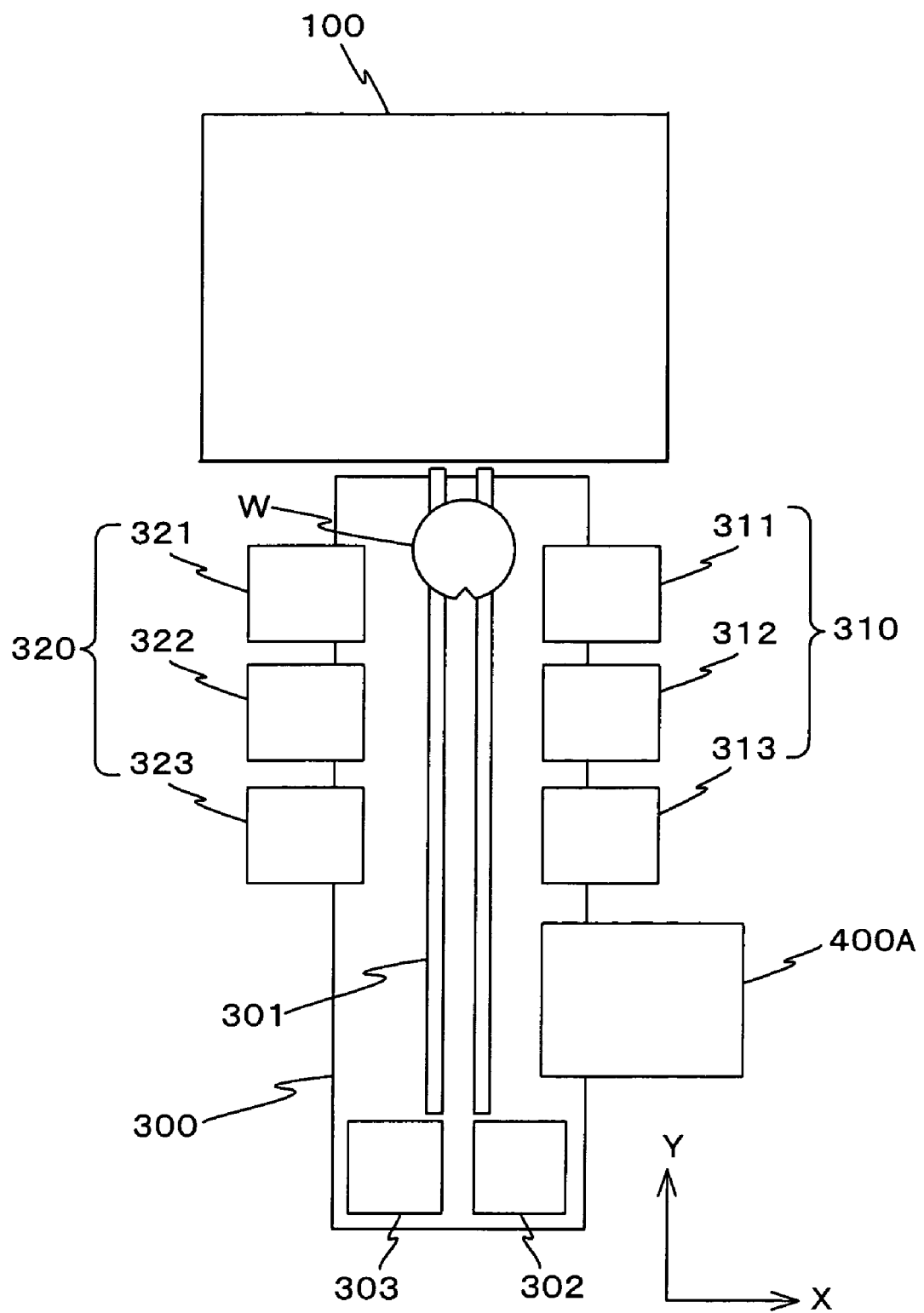
FIG. 5 is a view showing a schematic arrangement of a track related to the first embodiment of the present invention.

The configuration of each unit constituting coater section 310 (a resist coater 311, pre-bake unit 312, and a cleaning unit 313), each unit constituting developer section 320 (post-bake unit 321, a cleaning unit 322, and a developing unit 323), and wafer measuring instrument 400A and their arrangement shown in FIG. 5 is a mere example. In actual, a plurality of other processing units, buffer units, and the like are further installed, and each unit is arranged spatially, and robot arms and elevating instruments are also installed in between the units for carrying wafer W or wafer holder WH. Further, the path that wafer W takes through the units on processing is optimized from the viewpoint of speeding up the processing contents of the processing units and the total processing time, and the path can be dynamically changed.

In exposure apparatus 100, main controller 20, coater section 310 and developer section 320, and wafer measuring instrument 400A and analysis system 600 equipped in the apparatus are linked by wired or wireless connections, and signals that show the beginning of processing or the end of processing for each unit are transmitted over the connection. Further, in the first embodiment, measurement results measured by wafer measuring instrument 400A (data (surface shape data) corresponding to the surface shape of wafer W computed by processing unit 71 of wafer measuring instrument 400A) is sent (notified) to analysis system 600, however, the data can be sent directly to main controller 20 of exposure apparatus 100 instead of analysis system 600, or sent to main controller 20 of exposure apparatus 100 via analysis system 600.

Wafer measuring instrument 400A can measure the surface shape of wafer W after the mark formation is completed on the preceding layer; however, the measurement can be performed after wafer W has been carried to track 300, preferably after the resist has been coated, and also before wafer W is carried to exposure apparatus 100. The installation place of wafer measuring instrument 400A is not limited within track 300 like the first embodiment, and for example, wafer measuring instrument 400A can be outside track 300 as long as it is within the chamber of exposure apparatus 100. Or, an exclusive measurement unit independent from the units above can be arranged and connected by a carrier unit. However, in the case wafer measuring instrument 400A is installed within track 300, it is advantageous to throughput since the pre-processing of wafer W and automatic measurement of the surface shape can be collectively performed.

Wafer processing in exposure system 200 is performed in each of the substrate processing unit, and each substrate processing unit operates under the overall control/management of exposure process controlling controller 500. In a storage unit, which is an adjunct to exposure process controlling controller 500, exposure process controlling controller 500 accumulates various information for controlling the process of each lot or each wafer processed in exposure system 200, and for such control, accumulates various information such as various parameters, exposure record data, and the like. And, based on such information, exposure process controlling controller 500 controls/manages each substrate processing unit so that an appropriate processing is performed on each lot.

Further, analysis system 600 is a unit that operates independently from exposure apparatus 100, track 300 (wafer measuring instrument 400A), the light source of exposure apparatus 100, reticle measuring instrument 800A, and the like, and analysis system 600 gathers various data across the network from the units above, and performs necessary analysis processing.

In-house production control host system 700 has overall control over all the semiconductor manufacturing process within the substrate processing factory.

Figure 7:
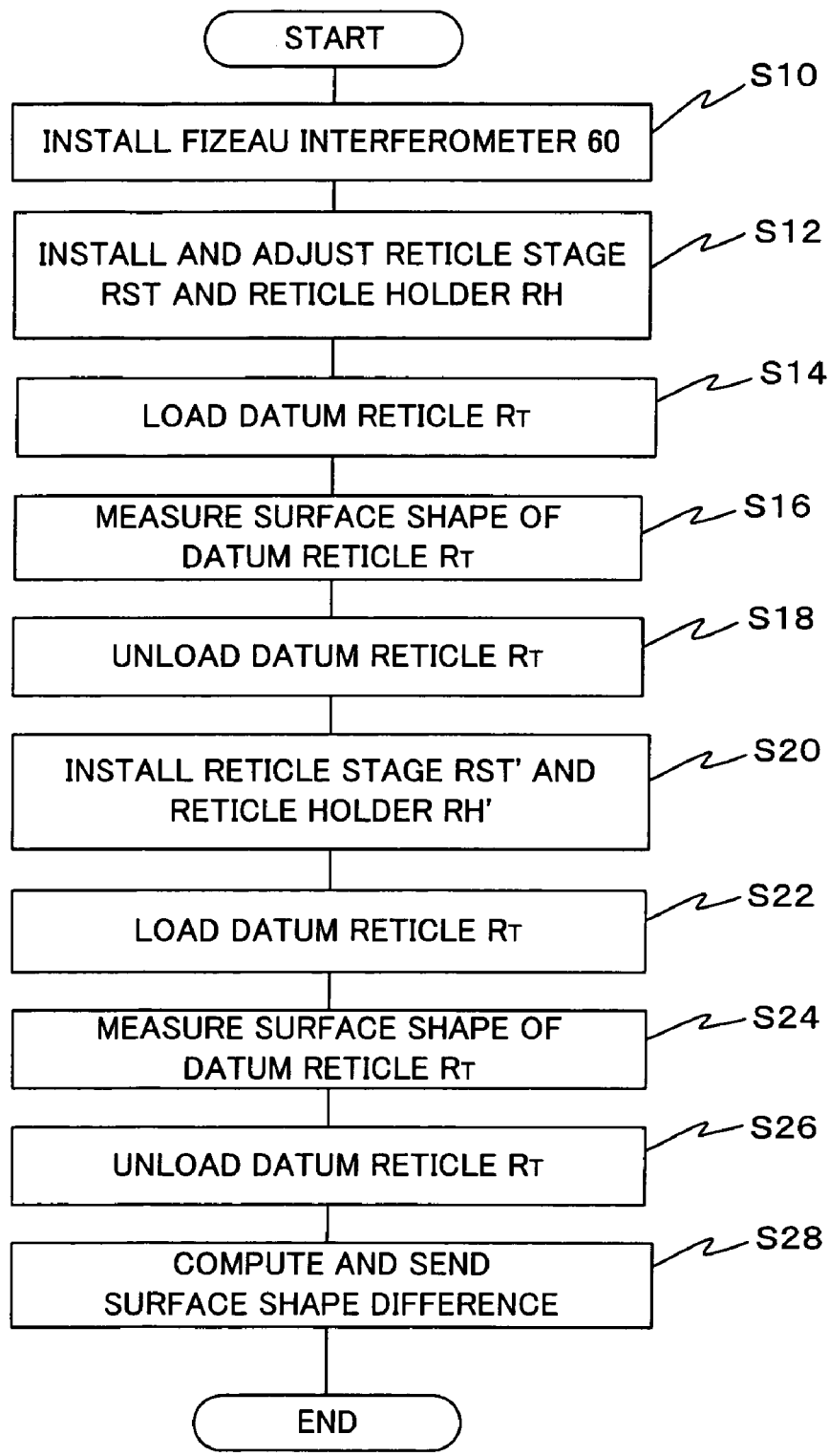
FIG. 7 is a flow chart showing a processing procedure of a preparatory processing when pre-measuring the surface shape of a reticle related to the first embodiment of the present invention.

Preparatory Processing for Pre-measuring the Surface Shape of the Reticle Pattern Surface Next, in exposure system 200 shown in FIG. 1, the preparatory processing for measuring the surface shape of the pattern surface of reticle R in advance in a similar state as in the state where the reticle is held by retile holder RH will be described, referring to the flow chart in FIG. 7. The preparatory processing is performed along with the assembly of exposure apparatus 100, reticle measuring instrument 800A, or track 300 within the substrate processing factory. Incidentally, at this point, the assembly and the adjustment of the components other than reticle measuring instrument 800A and exposure apparatus 100 in exposure system 200 are to be completed, and in-house production control host system 700 and exposure process controlling controller 500 are to be operating. In the preparatory processing, a datum reticle RT serving as a datum object whose entire pattern surface is evaporated with chromium is used.

First of all, in step S10, Fizeau interferometer 60 is installed within reticle measuring instrument 800A, and Fizeau interferometer 60 is adjusted to a state where Fizeau interferometer 60 can measure the surface shape of the pattern surface (surface subject to detection) of reticle R, as is shown in FIG. 4. That is, the optical system in Fizeau interferometer 60 is installed in the state shown in FIG. 4. This adjustment may be performed automatically with an assembly robot. In this adjustment, the adjustment so that the measurement results of Fizeau interferometer 60 can be sent from processing unit 71 to analysis system 600 is also performed. At this point, in reticle measuring instrument 800A, reticle stage RST' and reticle holder RH' are not installed in the state shown in FIG. 4. Further, at this point, reference plane member 68 does not have to be installed yet in the state shown in FIG. 4.

In the next step, step S12, reticle stage RST and reticle holder RH that are to be installed in exposure apparatus 100 are installed in the same manner as reticle stage RST' and reticle holder RH' shown in FIG. 4. And, adjustment is also made so that reticle R can be held by suction on reticle holder RH', as well as adjustment of the position, attitude, and the like of reticle R and the mark plate with respect to Fizeau interferometer 60 so that the surface shape of reticle R and the mark plate can be measured in an appropriate state using Fizeau interferometer 60.

In the next step, step S14, datum reticle RT is loaded onto reticle holder RH using the reticle carrier system (not shown), and reticle holder RH holds datum reticle RT by suction. Then, in the next step, step S16, the surface shape of the pattern surface of datum reticle $R_T$ is measured, using Fizeau interferometer 60. The measurement results are sent to analysis system 600 from processing unit 71. Further, in the next step, S18, datum reticle $R_T$ is unloaded using the reticle carrier system (not shown), and then put on standby at an appropriate place.

In the next step, step S20, reticle stage RST and reticle holder RH are detached from reticle measuring instrument 800A, and then reticle stage RST' and reticle holder RH' are installed. And, adjustment is also made so that datum reticle RT can be held by suction on reticle holder RH, as well as adjustment of the position, attitude, and the like of reticle R and the mark plate with respect to Fizeau interferometer 60 so that the surface shape of reticle R and the mark plate can be measured in an appropriate state using Fizeau interferometer 60.

In the next step, step S22, datum reticle $R_T$ that has been put on standby using the reticle carrier system (not shown) also put on standby is loaded on reticle holder RH, and reticle holder RH holds datum reticle $R_T$ by suction. Then, in the next step, step S24, the surface shape of the pattern surface of datum reticle $R_T$ is measured, using Fizeau interferometer 60. The measurement results are sent to analysis system 600 from processing unit 71. Further, in the next step, S26, datum reticle $R_T$ is unloaded using the reticle carrier system (not shown), and then returned to its storage place.

In the next step, step S28, analysis system 600 computes the surface shape difference data corresponding to the difference between the surface shape data obtained in step S16 of the pattern surface of datum reticle $R_T$ in a state held on reticle holder RH and the surface shape data obtained in step S24 of the pattern surface of datum reticle $R_T$ in a state held on reticle holder RH'. In this case, the surface shape difference (the difference of signals corresponding to the surface shape of each pattern surface when signals corresponding to the mark plate are overlaid) when the measurement results of the height of the mark plate of reticle stage RST' serves as a datum (made to coincide) is computed. Analysis system 600 stores the computation results, and controls the results so that they can be read at any time. After the completion of step S28, then the preparatory processing is completed.

After such preparatory processing has been performed, each component of exposure system 200 is finally assembled (For example, in exposure apparatus 100, reticle stage RST and reticle holder RH are installed as is shown in FIG. 2. Reticle stage ST' and reticle holder RH' in reticle measuring instrument 800A are already installed in a state shown in FIG. 4, after performing the process described above.), and are adjusted to an operable state.

The processing similar to the one described above is performed for wafer measuring instrument 400A. More specifically, wafer stage WST and wafer holder WH are installed instead of wafer stage WST' and wafer holder WH', and the surface shape of a datum wafer when the datum wafer serving as a datum object whose surface is mirror polished is held by suction is measured by Fizeau interferometer 60. Then, wafer stage WST' and wafer holder WH' are installed, and the surface shape of the datum wafer when the datum wafer is held by wafer holder WH is measured by Fizeau interferometer 60, and analysis system 600 obtains the surface shape data for each case with the surface of the mark plate corresponding to fiducial mark plate FM serving as the datum. Analysis system 600 stores the surface shape data in the storage unit (not shown), and controls the data so that it can be read at any time.

The preparatory processing described above is performed in all of the exposure apparatus 100 in exposure system 200. Further, in the case the exposure apparatus can each selectively choose the reticle holder used for exposure (the holder that actually holds reticle R) from a plurality of reticle holders RH, the operation described above is performed for each of the plurality of reticle holders RH, and the surface shape difference between the holders and reticle holder RH' of reticle measuring instrument 800A is obtained by analysis system 600. Analysis system 600 makes all the plurality of reticle holders RH and the surface shape data computed in the manner described above for all reticle holders RH correspond, stores the corresponding data in the storage unit (not shown), and controls the data so that when any one of the reticle holders RH is used, the surface shape data corresponding to reticle holder RH that is used can be read at any time.

Wafer Process

Figure 11:
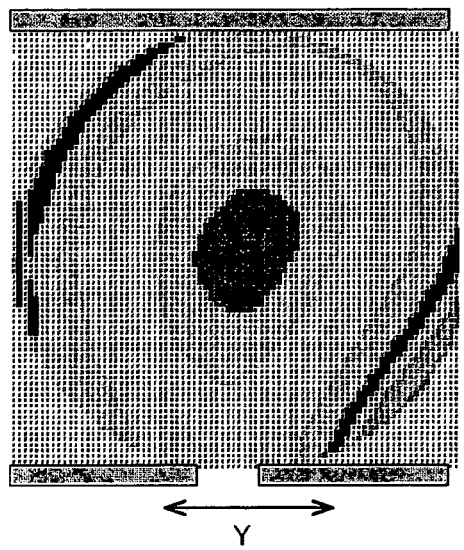
FIG. 11 is a view showing an example (No. 1) of results when measuring the surface shape of a reticle.
Figure 12:
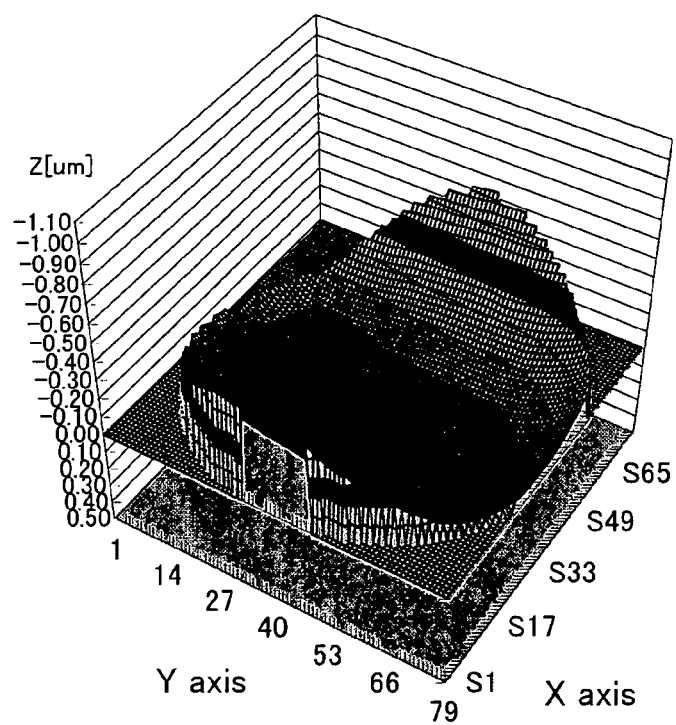
FIG. 12 is a view showing an example (No. 2) of results when measuring the surface shape of a reticle.
Figure 13:
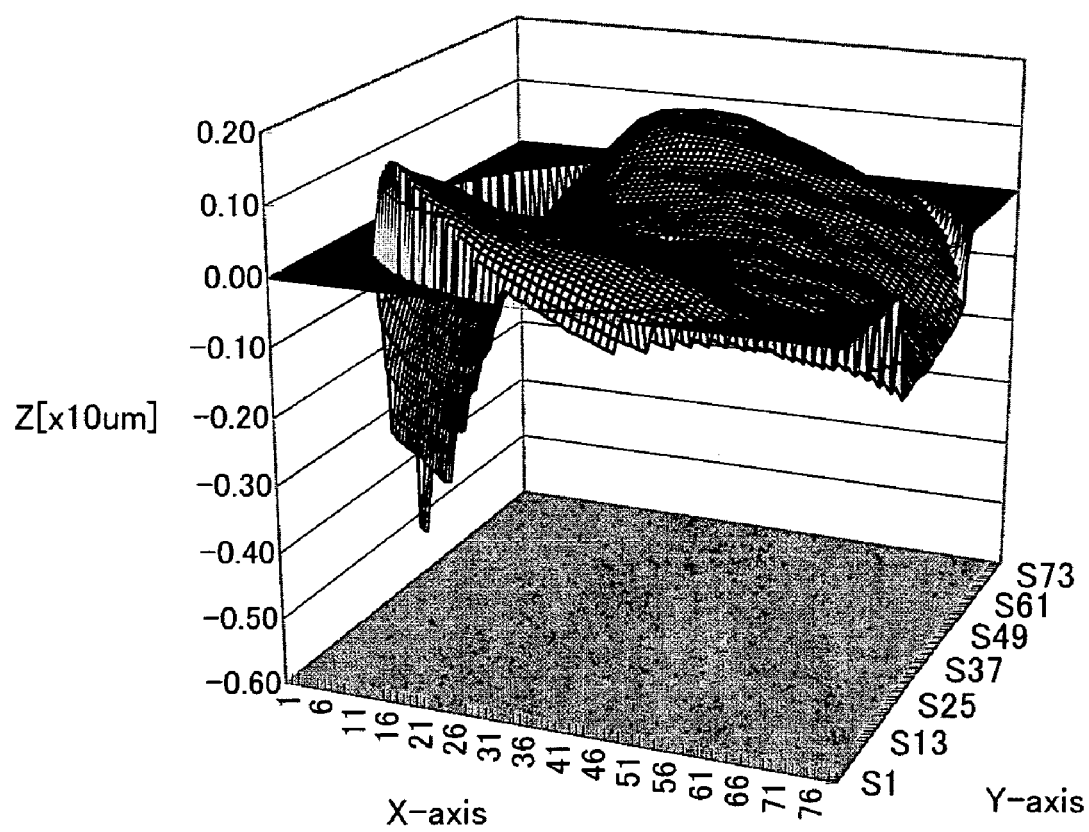
FIG. 13 is a view showing an example (No. 3) of results when measuring the surface shape of a wafer.

Next, the operation in exposure system 200 shown in FIG. 1, in the case of performing exposure on a wafer W that has already completed exposure of the first layer, will be described, referring to the flowcharts in FIGS. 8 to 10 and to FIGS. 11 to 13. As a premise, in exposure apparatus 100, by projected image (aerial image) measuring processing of the reticle mark plate arranged on reticle stage RST or by test exposure, the projection image plane (best image-forming plane) of the reticle mark plate by projection optical system PL is to be detected, and as for focus leveling control of wafer stage WST by stage controller 19, the detection offset of the focal point position detection system (60a, 60b) is to be adjusted so that a focus leveling in which the surface corresponding to exposure area IA of wafer W coincides with the best image-forming plane that has been detected is performed.

Figure 8:
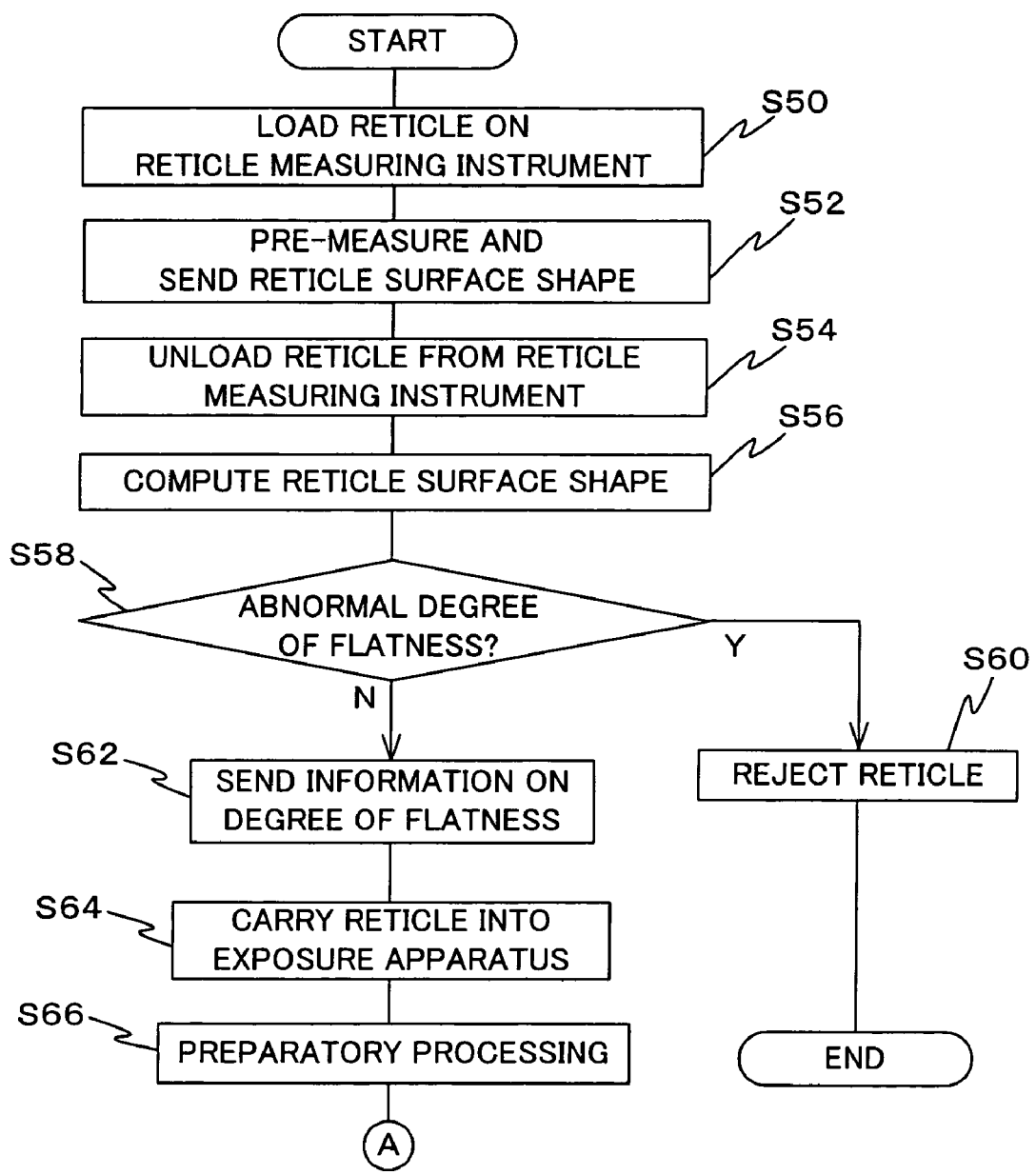
FIG. 8 is a flow chart showing a processing procedure when measuring the surface shape of a reticle related to the first embodiment of the present invention.
Figure 9:
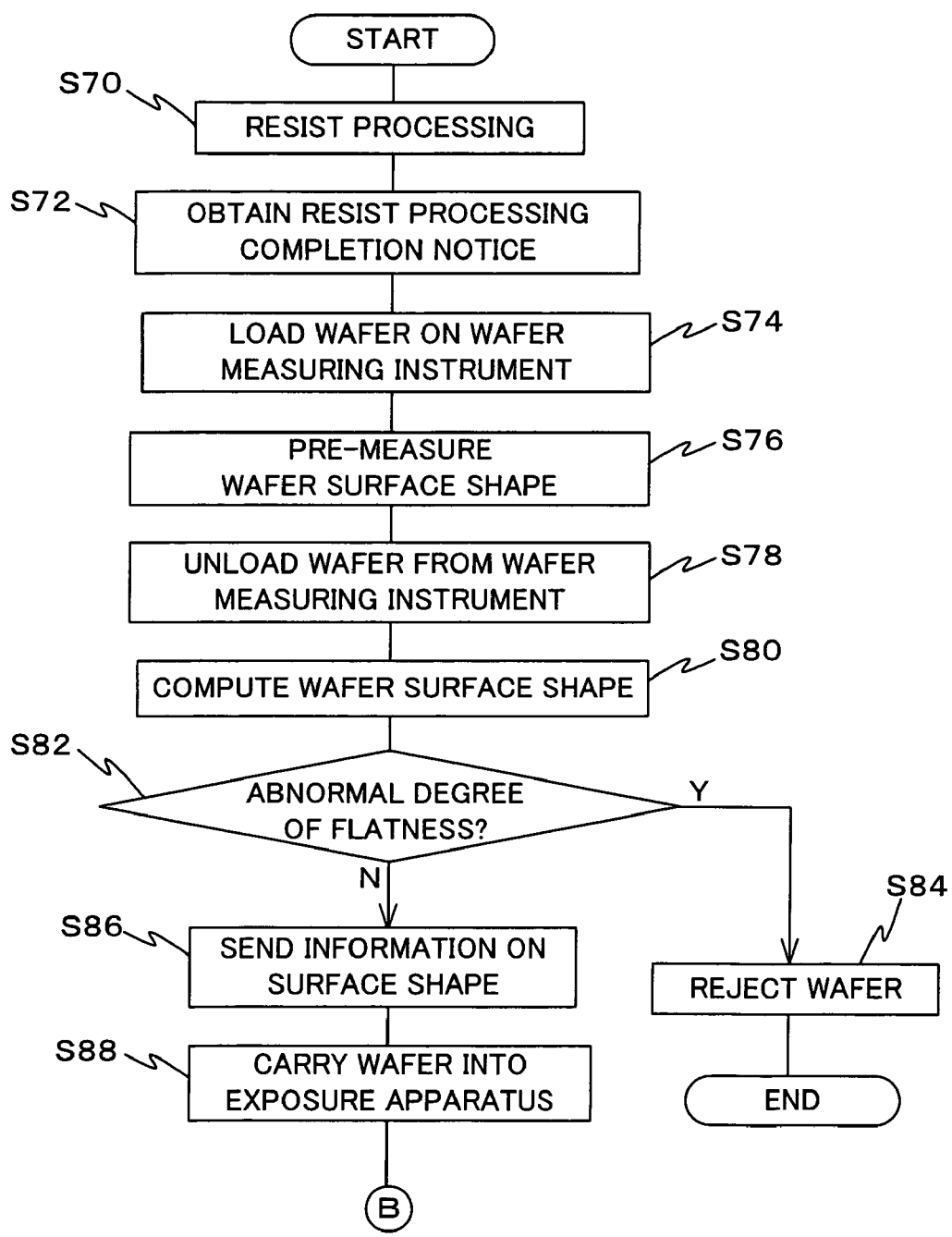
FIG. 9 is a flow chart showing a processing procedure when measuring the surface shape of a wafer related to the first embodiment of the present invention.

As is shown in FIG. 8, first of all, in step S50, exposure process controlling controller 500 carries reticle R, which is to be loaded into exposure apparatus 100, to reticle measuring instrument 800A by the reticle carrier system (not shown) under the control of in-house production control host system 700, and then loads reticle R onto reticle holder RH'. In the next step, step S52, reticle measuring instrument 800A measures the surface shape corresponding to the pattern surface of reticle R in a state held by reticle holder RH' The surface shape data R (x, y) (x and y are position coordinates in the X-axis direction and the Y-axis direction whose origin is the pattern center of reticle R) that has been measured is sent to analysis system 600. FIGS. 11 and 12 show an example of a surface shape R (x, y) that has been measured. FIG. 11 shows the change in the Z position of the pattern surface of reticle R with respect to the XY plane when viewed from the +Z side, whereas FIG. 12 shows a three-dimensional graph of the Z position of the pattern surface of reticle R with respect to the XY plane. As is shown in FIGS. 11 and 12, when reticle R is held by reticle holder RH', reticle R is deformed into a shape in which the area around the center of the pattern surface of reticle R is depressed in the section that is held. As is shown in FIG. 12, the difference between the maximum value and minimum value of the Z position of the pattern surface of reticle R is around 0.5 micron. In the graph in FIG. 12, the minimum value of the Z position of the surface of the mark plate of reticle R is shown as the origin.

Referring back to FIG. 8, in step S54, the reticle carrier system (not shown) unloads reticle R from reticle measuring instrument 800A. Then, the reticle carrier system continues to carry reticle R to exposure apparatus 100.

In the next step, step S56, analysis system 600 computes the surface shape data of reticle R in a state substantially equivalent to a state where reticle holder RH in exposure apparatus 100 holds reticle R. More particularly, based on the surface shape data computed in step S28 (to be referred to as dR (x,y)) and the surface shape data of reticle R (R (x,y)) obtained in a state held by reticle holder RH' in step S52, analysis system 600 computes the surface shape data of reticle R in a state substantially equivalent to a state where reticle holder RH in exposure apparatus 100 holds reticle R (R' (x,y)=R (x,y)+dR (x,y)). Surface shape data R' (x,y) of reticle R is sent to exposure process controlling controller 500 from analysis system 600.

In the next step, step S58, exposure process controlling controller 500 judges whether the degree of flatness of the pattern surface of reticle R is abnormal or not, or in other words, whether or not reticle R can satisfy the required precision for the degree of flatness. In this case, from surface shape data R' (x,y) of the pattern surface of reticle R obtained in the manner described above, an index value for the degree of flatness is computed, and the above judgment is made based on the value. For example, in this case, when the difference between the maximum value and minimum value of the surface position in surface shape data R' (x,y) is not within a permissible range, then the degree of flatness of reticle R is judged abnormal. When this judgment is affirmed, then the step proceeds to step S60 where instructions are given to reject reticle R (or encourage rejection of reticle R using the display functions on the monitor), and the processing is completed. Meanwhile, when the judgment is denied, then the step proceeds to step S62.

In step S62, exposure process controlling controller 500 sends surface shape data R' (x,y) to main controller 20, or makes analysis system 600 send surface shape data R' (x,y) of the pattern surface of reticle R to main controller 20. In the next step, step S64, reticle R is carried into exposure apparatus 100, and reticle R is held by suction on reticle holder RH as is shown in FIG. 2. Then, in the next step, S66, exposure process controlling controller 500 instructs exposure apparatus 100 to perform preparatory operations related to reticle R such as reticle alignment by the reticle alignment system (not shown) and baseline measurement, using the reticle alignment system (not shown), alignment system ALG, and the like. Since the series of operations in exposure apparatus 100 in this case is the same as in a typical scanner, a detailed description will be omitted. After step S66 has been completed, the step then proceeds to step S70 in FIG. 9.

In step S70, exposure process controlling controller 500 instructs the substrate processing unit, that is, exposure apparatus 100 and track 300 (coater section 310, developer section 320, wafer measuring instrument 400A, and the like), to perform processing of wafer W in a predetermined procedure. When the substrate processing unit receives the instructions, one wafer W, which is taken out from wafer carrier 302, is carried on carrier line 301 to resist coater 311. Then, wafer W is carried into resist coater 311 and the photoresist is coated on wafer W, and then wafer W is further carried along carrier line 301 to pre-bake unit 312 and cooling unit 313 where resist processing is performed on wafer W. When the resist processing of wafer W has been completed, track 300 sends a notification to inform the completion of the resist processing to exposure process controlling controller 500. Then, in step S72, exposure process controlling controller 500 obtains the notice.

In the next step, step S74, exposure process controlling controller 500 has wafer W loaded on wafer measuring instrument 400A, an in step S76, makes wafer measuring instrument 400A measure the surface shape of wafer W so as to obtain its surface shape data, surface shape data W (x,y). FIG. 13 shows an example of surface shape data W (x,y) obtained at this point.

In the next step, step S78, wafer W is unloaded from wafer measuring instrument 400A and is carried to exposure apparatus 100 by the carrier system (not shown). Then, in step S80, based on surface shape data (to be referred to as dW (x,y)) and the surface shape data of wafer W (W (x,y)) obtained in a state held by wafer holder WH' in step S76, exposure process controlling controller 500 makes analysis system 600 compute the surface shape data of wafer W in a state substantially equivalent to a state where wafer holder WH holds wafer W (W' (x,y)=W (x,y)+dW (x,y)). Surface shape data W' (x,y) of wafer W that has been computed is sent to exposure process controlling controller 500 from analysis system 600.

In the next step, step S82, exposure process controlling controller 500 judges whether the degree of flatness of wafer W can satisfy the required precision for the degree of flatness. This judgment is made by computing an index value that shows the degree of flatness based on surface shape data W' (x,y) of wafer W, and using the values as the judgment criteria. For example, when the difference between the maximum value and minimum value in surface shape data W' (x,y) is not within a permissible range, then the degree of flatness does not satisfy the required precision, therefore, the degree of flatness can be judged abnormal. When this judgment is affirmed, then the step proceeds to step S84 where instructions are given to reject wafer W (or encourage rejection of wafer W using the display functions on the monitor), and the processing is completed.

Meanwhile, when the judgment is denied, then the step proceeds to step S86. In step S86, exposure process controlling controller 500 sends surface shape data W' (x,y) of wafer W to main controller 20, or gives instructions to analysis system 600 to send surface shape data W' (x,y) of wafer W to main controller 20. In the next step, step S88, exposure process controlling controller 500 instructs track 300 to carry wafer W to exposure apparatus 100. Accordingly, wafer W is carried into exposure apparatus 100. Along with this operation, exposure process controlling controller 500 instructs exposure apparatus 100 to start the series of exposure operations. Hereinafter, the operations in step S90 to S108 in FIG. 10 are to be performed by main controller 20 in exposure apparatus 100.

Instep S90, main controller 20 to which the instructions are sent performs the so-called wafer pre-alignment with a pre-alignment unit (not shown). In the wafer pre-alignment, the pre-alignment unit adjusts the rotation deviation and center position deviation of wafer W to wafer stage WST with high precision so that the stage coordinate system (in the first embodiment, an XY coordinate system) that sets the movement position (the position based on the measurement values of wafer interferometer 54W) of wafer stage WST and the coordinate system (wafer coordinate system) set by the arrangement of the shot areas on wafer W coincides to a certain level.

In the next step, step S92, wafer W is loaded onto wafer holder WH on wafer stage WST, via a wafer loader (not shown) Then, wafer alignment is performed in the next step, step S94. In this case, wafer alignment by the EGA method or the like using alignment system ALG is performed. Details on wafer alignment by the EGA method are disclosed in, for example, Kokai (Japanese Unexamined Patent Application Publication) No. 61-44429 and the corresponding U.S. Pat. No. 4,780,617, and the like, therefore a detailed description here will be omitted. As long as the national laws in designated states (or elected states), to which this international application is applied, permit, the above disclosures of the publication and the U.S. Patent are incorporated herein by reference.

In the next step, step S96, surface shape data R' (x,y) of the pattern surface of reticle R is converted into a curved surface on the image plane. This conversion is performed using the projection magnification of projection optical system PL. The converted surface shape data will be expressed as R" (x,y). R" (x,y) can be regarded as data that shows the deviation amount of the image plane of the pattern image of reticle R from a datum surface by the evaluation mark image of the reticle mark plate.

Next, in step S98, the value of a counter p (hereinafter referred to as 'counter value p') that shows the arrangement number of the shot area is set to 1, and the first shot area is set as the area subject to exposure.

Next, in step S100, main controller 20 moves wafer stage WST via stage controller 19 and wafer stage drive section 56W so that wafer W is positioned at the acceleration starting position for exposing the area subject to exposure, as well as move reticle stage RST via stage controller 19 and reticle stage drive section 56R so that reticle R is positioned at the acceleration starting position, based on the arrangement coordinates (the center position coordinates of each shot area) of the area subject to exposure. More particularly, main controller 20 moves Z-tilt stage 38 (wafer stage WST) to the scanning starting position (acceleration starting position) for exposing the first shot area on wafer W, as well as move reticle stage RST to the scanning starting position (acceleration starting position) while monitoring the positional information from interferometers 54W and 54R, based on the arrangement information of each shot area on wafer W obtained as the results of wafer alignment and the baseline of alignment system ALG.

In the next step, step S102, relative scanning of reticle stage RST and wafer stage WST begins. And, when both stages RST and WST reach their target scanning speed and move into a constant speed synchronous state, illumination light IL from the illumination system (not shown) begins to illuminate the pattern area of reticle R, and scanning exposure begins. Then, different areas in the pattern area of reticle R are sequentially illuminated by illumination light IL, and when the entire surface of the pattern area has been illuminated, scanning exposure is completed. By this operation, the circuit pattern or the like of reticle R is reduced and transferred onto the area subject to exposure on wafer W via projection optical system PL. That is, in this case, exposure by the step-and-scan method is performed.

During the scanning exposure, main controller 20 drives the movable lenses via image-forming characteristics correction controller 48 according to the Y coordinates of reticle stage RST based on surface shape data R" (x,y) of reticle R, which is a wafer image plane conversion obtained in step S96 above. Main controller 20 also drives Z-tilt stage 38 via stage controller 19 and actuators 21A to 21C based on the output of the focal point position detection system (60a, 60b), so as to control the surface of wafer W so that the surface coincides with the scanning image plane after correction.

By this operation, during scanning exposure, the primary component of the image plane change due to the surface shape change in the section corresponding to the illumination area IAR of reticle R in the non-scanning direction (the X-axis direction) is corrected by rolling (tilt in the X-axis direction) control of Z-tilt stage 38 while the component secondary or larger is corrected by driving the movable lenses, the image plane change in the scanning direction (the Y-axis direction) is corrected by pitching (tilt in the Y-axis direction) control of Z-tilt stage 38, and the offset component of the image plane is corrected by controlling (focus control) Z-tilt stage 38 in the Z-axis direction.

Correction of the image-forming characteristics of projection optical system PL by driving the movable lens during scanning exposure, such as correcting the curvature of field, does not necessarily have to be performed constantly during scanning exposure, and can also be performed prior to scanning exposure. In this case, when the focus position changes due to the drive of the movable lenses, main controller 20 can compute prior to scanning exposure variation amount $\Delta Z'$ of the focus position that occurs, and during the scanning exposure, main controller 20 can perform the focus leveling control previously described based on a target value of the focus position, which is changed by only $-\Delta Z'$. By this operation, the curvature of field and defocus by the flexure of the pattern surface of reticle R are corrected, and the surface of wafer W is made to fall within the depth of focus range with high precision on the actual image plane with respect to the pattern surface of reticle R.

Further, during the scanning exposure, at the same time as the correction of surface shape data R" (x,y) of reticle R, the correction of position control of wafer stage WST using surface shape data W (x,y) of wafer W is also simultaneously performed. More specifically, based on the X position and Y position of wafer stage WST obtained from the measurement values of wafer interferometer 54W, position (x,y) of wafer W corresponding to exposure area IA is determined. Then, based on the surface of wafer W corresponding to exposure area IA computed from surface shape data W (x,y) of the wafer in position (x,y) of wafer W, for example, the detection offset of the focal point position detection system (60a, 60b) is adjusted. By this operation, regardless of the change of the surface shape of wafer W corresponding to exposure area IA with respect to the Z position of the fiducial mark plate of wafer W, the best image-forming plane and the surface of wafer W will coincide within the range of depth of focus.

In the next step, step S104, the judgment of whether or not exposure has been performed on all the shot areas is made, referring to counter value p. In this case, p=1, that is, exposure has only been performed on the first shot area, therefore, the judgment in step S104 is denied, and the step proceeds to step S106. In step S106, counter p is incremented by one (p←p+1), then the next shot area is set as the area subject to exposure, and the step returns to S100.

Hereinafter, the processing and judgment in step S100→step S102→step S104→step S106 are repeated until the judgment in step S104 is affirmed, and the circuit pattern or the like of reticle R is transferred onto the plurality of shot areas on the wafer. When the pattern has been transferred onto all the shot areas on wafer W, the judgment in step S104 is affirmed, and the step then moves to step S108. In step S108, main controller 20 instructs the wafer loader (not shown) to unload wafer W.

By the instructions, wafer W unloaded from wafer stage WST is carried to carrier line 301 of track 300 by a wafer unloader (not shown), and then is sequentially sent along carrier line 301 to post-bake unit 321, cooling unit 322, and then to developing unit 323. In the next step, step S110, in developing unit 323, a resist pattern image corresponding to the device pattern of the reticle is developed on each shot area of wafer W. Wafer W that has been developed is inspected by measuring units (not shown), which are built if necessary, such as units for measuring the line width of the pattern, overlay errors, and the like, and then is housed into wafer carrier 303 by carrier line 301.

In the next step, step S112, wafer W housed in wafer carrier 303 is carried to another processing unit where etching (scraping off the section that is not protected by the resist) is performed, and resist separation (step S96, separating the resist that has become unnecessary) is performed in step S114. In the case there is a next wafer W on which exposure is to be performed by exposure apparatus 100, the processing in S70 to S114 described above is repeatedly performed on the next wafer W. By this operation, multiple circuit patterns are formed, for example, onto one lot of wafer W housed in wafer carrier 302.

Pipeline Processing

In the processing procedure of the first embodiment described above, by performing the measuring process (step S70 to step S88 in FIG. 9) of the surface shape of wafer W with wafer measuring instrument 400A before carrying wafer W into exposure apparatus 100, concern arises that throughput of the wafer process processing will decline. However, by applying pipeline processing in the following description, it becomes possible to prevent the throughput from declining. The details are described below, referring to FIG. 14.

Since the measuring process of the surface shape of wafer W has been added, the wafer process processing consists of five processes; a resist processing process A in which a resist film is formed, a measuring process B of the surface shape of the wafer by wafer measuring instrument 400A, an exposure process C in which alignment and exposure are performed, a developing process D in which heat treatment and development after exposure are performed, and a pattern size measuring process E in the case when the resist pattern is measured. In the five processes, pipeline processing in which processing is performed in parallel on a number of wafer Ws (in the same drawing, three) is performed. To be more specific, further, by performing measuring process B of wafer W in parallel with exposure process C of the preceding wafer W, the influence on the entire throughput can be suppressed to an extremely small level.

Further, in the case of executing resist size measuring process E after executing developing process D, by measuring pre-measuring process B and resist size measuring process E pipeline-wise with wafer measuring instrument 400A at a timing so that the two processes do not overlap each other, the equipment cost can be reduced since resist size measuring unit does not have to be separately arranged, and it also hardly has any adverse effect on the throughput.

Figure 14:
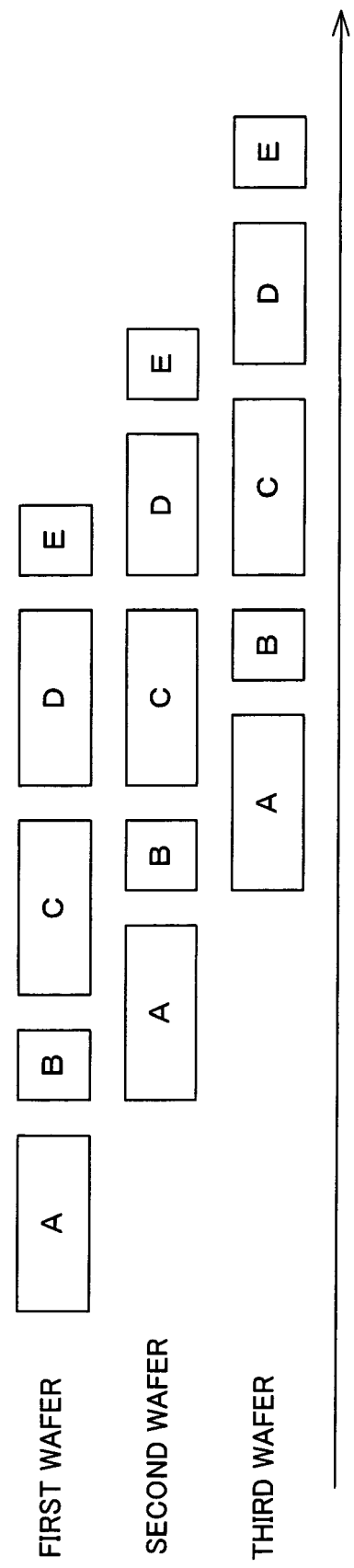
FIG. 14 is a view used for describing a pipeline processing in the first embodiment of the present invention.

The pipeline processing shown in FIG. 14 is a mere example, and it is a matter of course that the process can be scheduled so that while exposure of the preceding wafer is being performed, wafer pre-alignment of the following wafer W is performed.

As is described in detail above, according to the first embodiment, information related to the degree of flatness of reticle R and wafer W (the surface shape data R" (x,y), W' (x,y)) in a state equivalent to the state of being held by reticle holder RH and wafer holder WH is obtained, before carrying reticle R and wafer W used for exposure into exposure apparatus 100. By this operation, the information related to the degree of flatness of reticle R and wafer W can be recognized before exposure apparatus 100 performs exposure using the information without having any influence on the throughput of exposure apparatus 100.

More specifically, in the first embodiment, the surface shape of reticle R and wafer W is measured in a state where reticle holder RH' and wafer holder WH' whose difference (surface shape difference) between the surface shape of reticle R and wafer W in a state held by reticle holder RH and wafer holder WH and the surface shape in a state when reticle holder RH' and wafer holder WH' hold reticle R and wafer W is known hold reticle R and wafer W. And then, based on the surface shape data of reticle R an wafer W in a state held by reticle holder RH and wafer holder WH and the surface shape difference data described above, the surface shape data of reticle R and wafer W in an equivalent state as in the state held by reticle holder RH and wafer holder WH is computed. By this operation, it becomes possible to obtain the surface shape of reticle R and wafer W in an equivalent state as in the state when reticle R and wafer W are held by reticle holder RH and wafer holder WH, without having to have reticle holder RH and wafer holder WH directly hold reticle R and wafer W. Accordingly, the surface shape of reticle R and wafer W on exposure can be obtained in advance, before reticle R and wafer W are both carried into exposure apparatus 100.

Further, in the first embodiment, prior to the process of pre-measuring the surface shape of reticle R and wafer W, the surface shape of datum reticle $R_T$ and the datum wafer held by reticle holder RH and wafer holder WH and the surface shape of datum reticle $R_T$ and the datum wafer held by reticle holder RH' and wafer holder WH' are measured, and the difference of each measurement result is computed as the surface shape difference between reticle holder RH and reticle holder RH', and the surface shape difference between wafer holder WH and wafer older WH'. By obtaining such surface differences, it becomes possible to compute the surface shape of reticle R and wafer W in a state where reticle R and wafer W are held by reticle holder RH and wafer holder WH, without having to have reticle holder RH and wafer holder WH directly hold reticle R and wafer W.

Further, according to the first embodiment, based on the measurement results of the surface shape of reticle R and wafer W, the abnormality of the degree of flatness is detected, and when the degree of flatness is judged abnormal, reticle R and wafer W are rejected. By this operation, reticle R and wafer W that have been regarded abnormal are not used in exposure, and the exposure process can be appropriately performed.

Further, according to the first embodiment, as is described above, the surface shape data of reticle R and wafer W in the state equivalent to a state when held by reticle holder RH and wafer holder WH is measured. And, the circuit pattern or the like formed on reticle R is transferred on wafer W, while correction of the image-forming characteristics of projection optical system PL and correction of the relative position between reticle R and wafer W are performed, based on the measurement results, therefore, exposure can be achieved with high precision.

In the first embodiment, of the image-forming characteristics of projection optical system PL, focus, curvature of field, and distortion were corrected using image-forming characteristics correction controller 48, according to the surface shape of reticle R. By correcting such aberration components, it becomes possible to transfer the pattern of reticle R onto a desired position on wafer W.

Further, in the first embodiment, regarding the surface shape of wafer W, the detection offset of the focal point position detection system (60*a*, 60*b*) was adjusted as needed according to the surface shape, however, the present invention is not limited to this. For example, the image-forming characteristics of projection optical system PL can be adjusted using image-forming characteristics correction controller 48, based on the results of adding the sum of surface shape data R'' (x,y) of the image plane conversion of reticle R and surface shape data W''' (x,y) of wafer W to the section corresponding to exposure area IA.

In the first embodiment, although both the surface shape of reticle R and the surface shape of wafer W were measured beforehand (before carrying reticle R and wafer W into exposure apparatus 100), it is a matter of course that pre-measuring can be performed only on reticle R or wafer W. In the case the surface shape of only reticle R is reflected on the image-forming characteristics of projection optical system PL on exposure, focus, curvature of field, and distortion of projection optical system PL are adjusted as correctable aberration components, however in the case of the surface shape of only wafer W, then only focus of projection optical system PL is adjusted.

Further, in the first embodiment, in the case the degree of flatness of reticle R and wafer W does not meet the required accuracy, reticle R and wafer W were rejected, however, the present invention is not limited to this. In the case the surface whose degree of flatness is degraded is only an extremely small section, the remaining section can be used for exposure. For example, in the case a circuit pattern corresponding to a plurality of chip areas is formed in the pattern area of reticle R, exposure can be performed setting the reticle blind equipped in the illumination system (not shown) so that the chip area whose degree of flatness is degraded is not exposed. This is also the same for wafer W, and even in the case when the degree of flatness of the entire wafer W is above the permissible value, judgment of whether or not the degree of flatness is due to a partial degradation of flatness can be made, and it is possible to exclude only the shot area containing the section where the degree of flatness is degraded from the area subject to exposure.

In the case abnormal degree of flatness is detected, reticle holder RH can be exchanged with a different holder. More specifically, when exposure process controlling controller 500 judges that the degree of flatness is abnormal in step S58 in FIG. 8, then exposure process controlling controller 500 gives instruction to main controller 20 in exposure apparatus 100 to exchange reticle holder RH. Then, main controller 20 exchanges reticle holder RH using a reticle holder exchange system (not shown), before reticle R is carried into exposure apparatus 100.

Further, for example, in the case exposure apparatus 100 can select a reticle holder RH from among a plurality of reticle holders RH, and can mount the holder on reticle stage RST, exposure apparatus 100 can select a reticle holder RH whose degree of flatness is within the permissible range. In this case, analysis system 600 controls surface shape difference data dR (x,y), which is the surface shape difference between reticle holder RH' for each of the plurality of reticle holders RH equipped in exposure apparatus 100, stored in the storage unit (not shown). And, in step S56 in FIG. 8, analysis system 600 computes surface shape data R' (x,y), which is the sum of surface shape data R (x,y) of reticle R and surface shape data dR (x,y) of each of reticle holders RH, and based on the computation results, exposure process controlling controller 500 selects reticle holder RH whose degree of flatness of the pattern surface is most favorable. Exposure process controlling controller 500 sends information related to the selected reticle holder RH (such as the identification number of reticle holder RH) to main controller 20 of exposure apparatus 100. And before carrying reticle R into exposure apparatus 100, main controller 20 loads the selected reticle holder RH onto reticle stage RST. It is also a matter of course that the selection of the holder that has the most favorable degree of flatness can also be performed similarly for wafer holder WH.

Furthermore, the case can be considered where a foreign material being clamped in between reticle holder RH' and reticle R or wafer holder WH' and wafer W degrades the degree of flatness, therefore, reticle holder RH, wafer holder WH, reticle R, and wafer W can be cleansed, and then the measurement of the surface shapes can be performed again in reticle measuring instrument 800A and wafer measuring instrument 400A. More specifically, in the case the degree of flatness obtained from surface shape data R' (x,y) of reticle R exceeds a predetermined threshold value, exposure process controlling controller 500 will judge that the degree of flatness is abnormal, and have reticle holder RH and reticle R or wafer holder WH and wafer W carried to the cleaning unit equipped in the substrate processing factory, and have reticle holder RH and reticle R or wafer holder WH and wafer W cleaned. After the cleansing, reticle holder RH and reticle R or wafer holder WH and wafer W are carried to reticle measuring instrument 800A or wafer measuring instrument 400A, and the pre-obtaining process of the surface shape data shown in FIGS. 8 and 9 is performed.

In the first embodiment, the holding state of reticle R and wafer W that reticle holder RH' and wafer holder WH' hold can be adjusted. For example, in the case each pin in pin 32 of wafer holder WH' is connected to a piezo element or the like and the height of the tip section of each pin is adjustable, pin 32 may be adjusted so that the surface shape of the datum wafer in a state held by wafer holder WH and the surface shape of the datum wafer held by wafer holder WH' substantially coincide with each other, after preparatory processing of wafers like the ones shown in FIG. 7 is performed. By this operation, the surface shape in a state held by reticle holder RH and the surface shape in a state held by reticle holder RH' can substantially be in the same state, therefore, the measuring accuracy of the surface shapes can be further improved.

A Second Embodiment

Next, a second embodiment of the present invention will be described, referring to FIGS. 15 and 16. In the first embodiment above, the surface shape of wafer W in a state equivalent to the state where wafer W is held by wafer holder WH (a state where wafer W is held by another wafer holder WH' whose surface shape difference is known) is measured before wafer W is carried into exposure apparatus 100, however, in the second embodiment, the surface shape of wafer W held by wafer holder WH is measured in advance directly. For parts that have the same or similar arrangement as the first embodiment previously described, the same reference numerals will be used, and the description thereabout will be brief, or entirely omitted. An exposure system related to the second embodiment that can suitably perform the inspecting method and exposure method related to the present invention possesses the features of having a wafer measuring instrument 400B shown in FIG. 15 instead of wafer measuring instrument 400A (FIG. 6) in the first embodiment previously described, and further of having a carrier system (not shown) that can carry a wafer holder WH between exposure apparatus 100 and wafer measuring instrument 400B.

Figure 15:
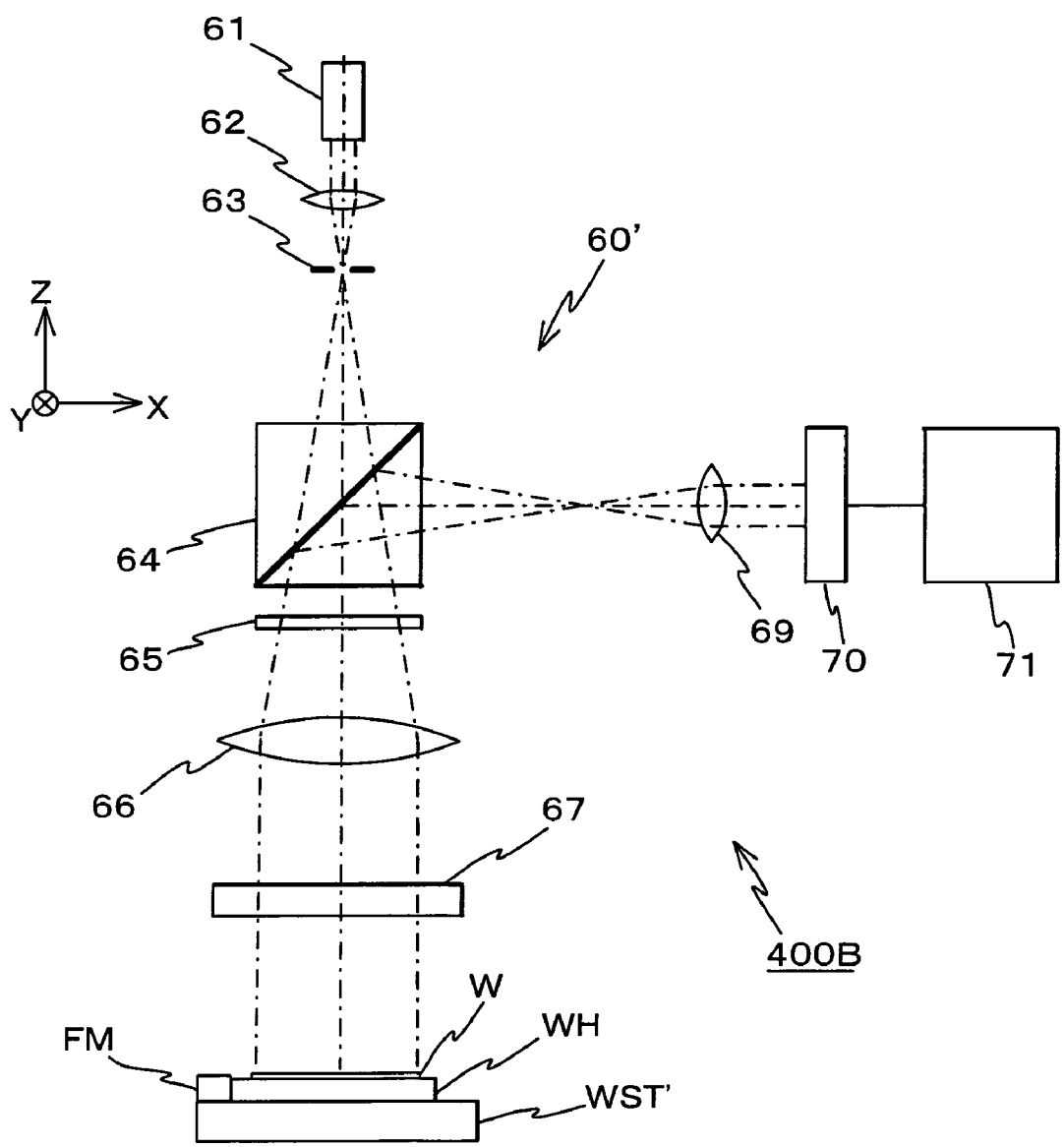
FIG. 15 is a view showing a schematic arrangement of a wafer measuring instrument related to a second embodiment of the present invention.
Figure 16:
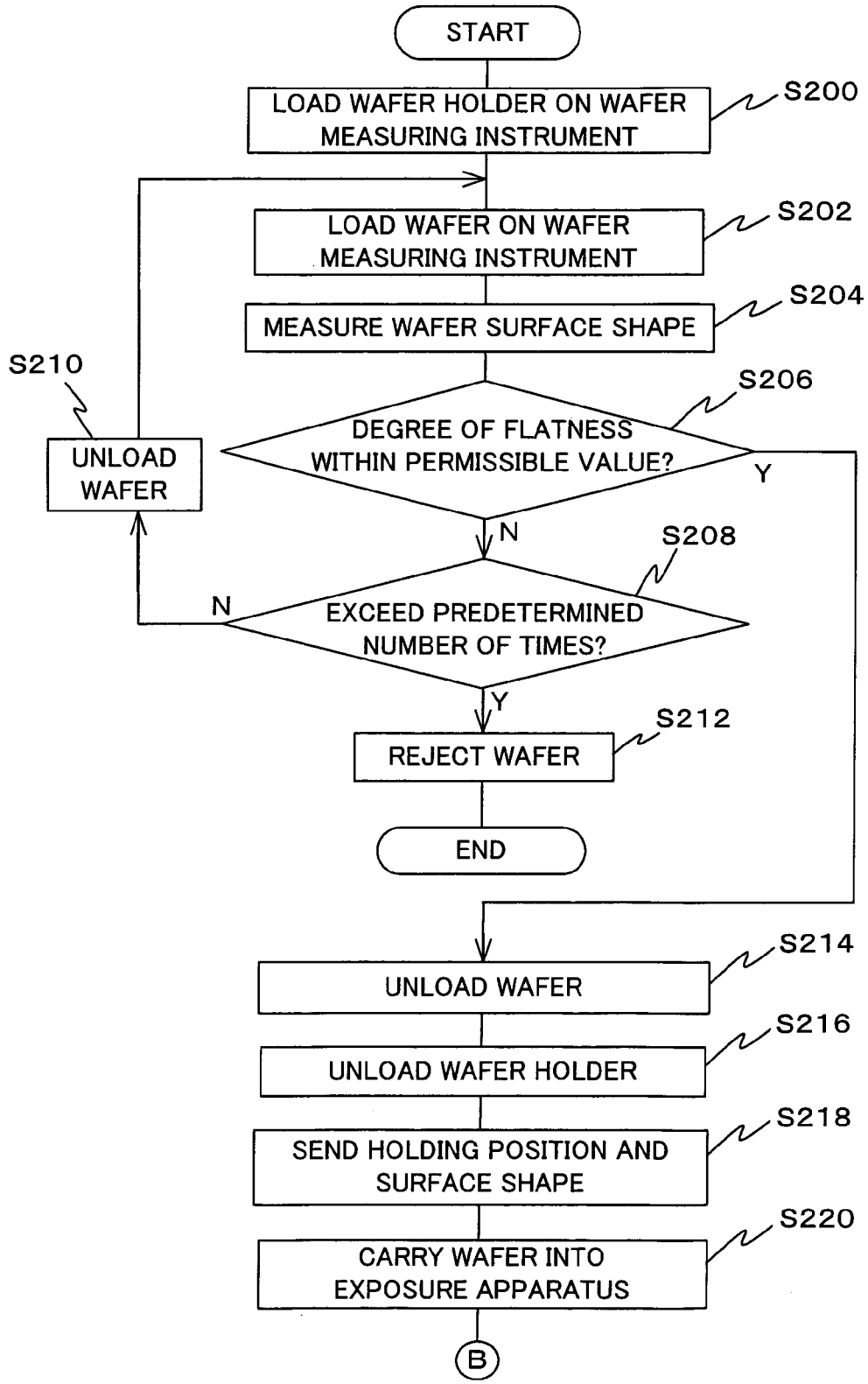
FIG. 16 is a flow chart showing a processing procedure when measuring the surface shape of a reticle related to the second embodiment of the present invention.

FIG. 15 shows a schematic configuration of wafer measuring instrument 400B. As is shown in FIG. 15, wafer measuring instrument 400B does not have an exclusive wafer holder WH' but has a wafer holder WH used in exposure apparatus 100 mounted on a wafer stage WST'. Wafer holder WH is carried by the carrier system of the wafer holder referred to above, and is loaded on wafer stage WST'. Wafer measuring instrument 400B measures the surface shape of wafer W in the state where wafer W is held by suction by wafer holder WH used in exposure apparatus 100, or in other words, in the same state as in the actual exposure of wafer W.

Next, the operation in the case of performing surface shape measurement of wafer W using wafer measuring instrument 400B shown in FIG. 15 will be described, referring to the flow chart in FIG. 16. This measuring operation is performed instead of step S74 to step S88 of the exposure operation in the first embodiment in FIG. 9.

First of all, in step S200, the carrier system of the wafer holder (not shown) carries wafer holder WH from exposure apparatus 100 to wafer measuring instrument 400B, and mounts wafer holder WH on wafer stage WST'. In the next step, step S202, wafer W is loaded on wafer holder WH mounted on wafer stage WST'. In the next step, step S204, wafer measuring instrument 400B measures the surface shape of wafer W, and sends surface shape data W' (x,y) of wafer W to exposure process controlling controller 500. In step S206, exposure process controlling controller 500 judges whether or not the degree of flatness based on surface shape data W' (x,y) is within a permissible range or not. When the judgment is denied, the step then moves to step S208, whereas if the judgment is affirmed, the step moves to step S214. In this case, surface shape data W' (x,y) of wafer W is outside the permissible range, therefore, the step moves to step S208. In step S208, exposure process controlling controller 500 judges whether or not the number of times of measurement of the surface shape of wafer W has exceeded a predetermined number of times (such as twice). In this case, since the measurement has been performed only once, the judgment is denied, therefore, the step then moves to step S210.

In step S210, wafer W is unloaded once using the carrier system (not shown), then the step returns to step S202 where wafer W is loaded onto wafer measuring instrument 400B again. When wafer W is loaded, the loading position of wafer W is to be shifted by a predetermined distance (for example, around 100 micron) from the previous loading position in step S202. Then, in step S204, the surface shape of wafer W is measured again in wafer measuring instrument 400B, and in step S206, exposure process controlling controller 500 obtains surface shape data W' (x,y), and judges whether or not the degree of flatness is within the permissible range or not.

As is described above, until the judgment in step S206 is affirmed, or the judgment in step S208 is affirmed, the loop processing of step S202 to step S210 is repeated while obtaining surface shape data W' (x,y) each time the holding position of wafer W on wafer holder WH is shifted. And, when the number of repetition of the loop processing exceeds a predetermined number of times, the judgment in step S208 is affirmed, and the step moves to step S212 where wafer W is rejected, which ends the processing.

Meanwhile, when the degree of flatness based on surface shape data W' (x,y) of wafer W falls within the permissible range and the judgment in step S206 is affirmed, then the step moves to step S214. In step S214, wafer W is unloaded (or unloading of wafer W is encouraged using the display functions on the monitor) and in the following step, step S216, wafer holder WH is unloaded (or unloading of wafer holder WH is encouraged using the display functions on the monitor), carried to exposure apparatus 100, and is mounted on wafer stage WST. Furthermore, in step S218, exposure process controlling controller 500 sends information on the holding unit of wafer W on wafer holder WH ultimately obtained and surface shape data W' (x,y) of wafer W at the holding position to main controller 20, and furthermore, in step S220, carries wafer W to exposure apparatus 100.

Figure 10:
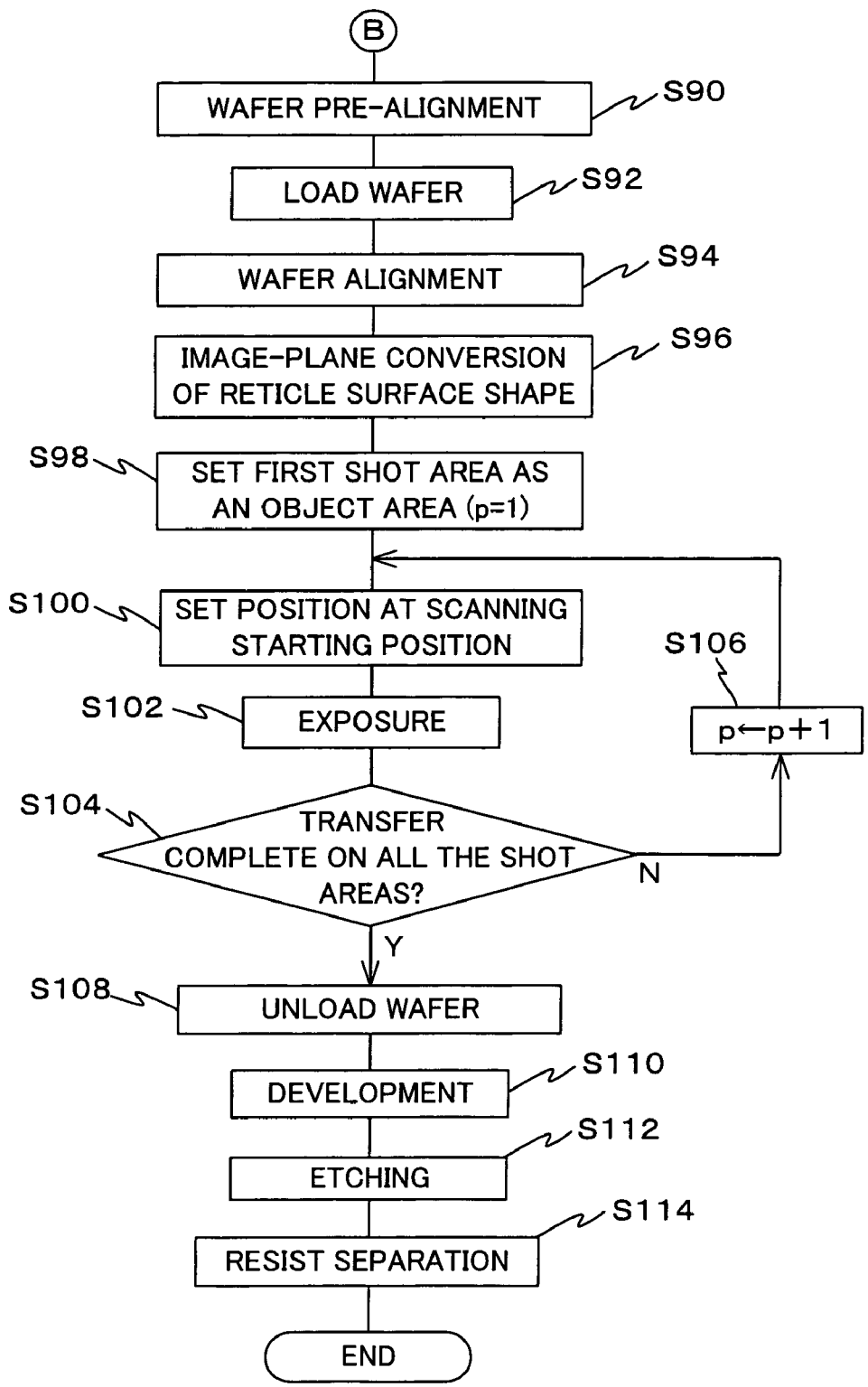
FIG. 10 is a flow chart showing a processing procedure of an exposure operation.

After step S220 is executed, as in the first embodiment described above, exposure processing of step S90 to step S108 in FIG. 10 is performed, and then development (step S110), etching (step S112), and resist separation (step S114).

As is described in detail so far, according to the second embodiment, because information related to the degree of flatness of wafer W is measured directly in advance before carrying wafer W into exposure apparatus 100 in a state where wafer W is held by wafer holder WH used in exposure apparatus 100, it becomes possible to directly measure the surface shape of wafer W as in the same state as during actual exposure, therefore, a high measuring accuracy can be obtained.

Further, according to the second embodiment, from another aspect, the holding state of wafer W is adjusted so that the degree of flatness of wafer W in a state held by wafer holder WH becomes favorable, and in the adjusted holding state, wafer holder WH holds wafer W while the pattern on reticle R is transferred onto wafer W. In such a case, when exposure is performed using wafer W held by wafer holder WH, wafer W can be held by wafer holder WH whose holding state has been adjusted so that the degree of flatness of wafer W is favorable, therefore, exposure with high precision can be achieved.

In the second embodiment, because wafer holder WH used in exposure apparatus 100 is carried to wafer measuring instrument 400B when the surface shape of wafer W is measured, exposure apparatus 100 cannot use wafer holder WH during this measurement. Accordingly, in the second embodiment, if a plurality of wafer holders WH is prepared and sequentially used, exposure in exposure apparatus 100 and measurement in wafer measuring instrument 400B can be performed in parallel at the same time. By this operation, it becomes possible to measure the surface shape of wafer W in advance, without reducing the throughput.

Further, according to the second embodiment, when the surface shape of wafer W is measured while adjusting the holding position of wafer W in wafer holder WH in steps S202 to S210 and wafer W is held by wafer holder WH in exposure apparatus 100, wafer W is to be held at the holding position where the degree of flatness of wafer W was most favorable. By this operation, wafer holder WH can hold wafer W in a state where the degree of flatness of wafer W is optimized.

In the second embodiment, in the case degree of flatness obtained from surface shape W (x,y) of wafer W is outside the permissible range, the holding position of wafer W on wafer holder WH was changed, however, the present invention is not limited to this, and the suction holding force of wafer holder WH can be changed instead. More specifically, after wafer W is unloaded in step S210 after the negative judgment in step S206 or in step S208, instead of changing the holding position of wafer W by loading wafer W in step S202, the vacuum pressure of wafer holder WH can be changed and the step can return to step S204 where the surface shape of wafer W is measured again. And the vacuum pressure can be changed within a predetermined range, and when surface shape W (x,y) of wafer W falls within the permissible range, the vacuum pressure can be sent to main controller 20 of exposure apparatus 100 as the vacuum pressure for maintaining the suction of wafer W, along with surface shape W (x,y) of wafer W.

In this case, when the degree of flatness of wafer W does not fall within the permissible range even if the vacuum pressure is changed within the predetermined range, the holding position of wafer W held by wafer holder WH can be changed and the vacuum pressure further adjusted. Further, in the case the degree of flatness of wafer W does not fall within the permissible range even if the holding position of wafer W is changed, wafer W can be held at the holding position where the degree of flatness was most favorable, and at the holding position, the vacuum pressure can be changed and the most favorable vacuum pressure can be selected as the optimal vacuum pressure.

Further, in order to judge whether the holding position of wafer W on wafer holder W is a favorable position or not, the vacuum pressure of wafer holder WH can be changed while holding wafer W at the holding position, and the change in the surface shape of wafer W can be measured. In this case, when the variation amount is larger than a predetermined value, then the holding position can be decided undesirable, and the holding position of wafer W by wafer holder WH can be changed. More specifically, a holding position where the degree of flatness hardly changes according to the vacuum pressure can be selected as the optimum holding position of wafer W. That is, the optimum holding position of wafer W in wafer holder WH can be obtained based on the degree (magnitude) of change of the surface shape of wafer W that occurs with the change in the vacuum suction force of wafer holder WH.

In the second embodiment, in the case when the degree of flatness obtained from the surface shape of wafer W is judged abnormal, wafer W was rejected in step S212, however, wafer W can be unloaded from wafer holder WH, and then the parts can be cleaned and the pre-measuring process described above can be tried again (or the point, that is, cleansing of both wafer W and wafer holder WH can be encouraged using the display functions on the monitor).

Further, in the second embodiment, when exposure apparatus 100 has a plurality of wafer holder WHs, the surface shape of wafer W can be measured in a state where one of the wafer holders WH holds wafer W, and the wafer holder WH whose degree of flatness was most favorable can be selectively used (or the selective usage of wafer holder WH whose degree of flatness was most favorable can be encouraged using the display functions on the monitor). More specifically, in step S206 in FIG. 16 where the judgment of whether or not the degree of flatness is within the permissible value is made, when the judgment is denied, then another wafer holder WH can be mounted on wafer measuring instrument 400B and the processing of measuring the surface shape in a state where the wafer holder WH holds wafer W can be repeated until the degree of flatness falls within the permissible range.

Further, in the second embodiment, the case has been described where the surface shape of wafer W held by wafer holder WH is measured directly in advance, however, it is a matter of course that the surface shape of reticle R held by reticle holder RH can be measured directly in advance. In this case, the exposure system has to have a reticle measuring instrument that can measure the surface shape of reticle R in advance in a state where reticle R is held by reticle holder RH, and also has to be further equipped with a carrier system (not shown) that carries reticle holder RH in between the measuring instrument and the exposure apparatus.

A Third Embodiment

Next, a third embodiment of the present invention will be described, referring to FIGS. 17 and 18. For parts that have the same or similar arrangement as the first embodiment previously described, the same reference numerals will be used, and the description thereabout will be brief, or entirely omitted. An exposure system related to the third embodiment possesses the feature of having a reticle measuring instrument 800C whose arrangement is modeled in a perspective view in FIG. 17.

Figure 17:
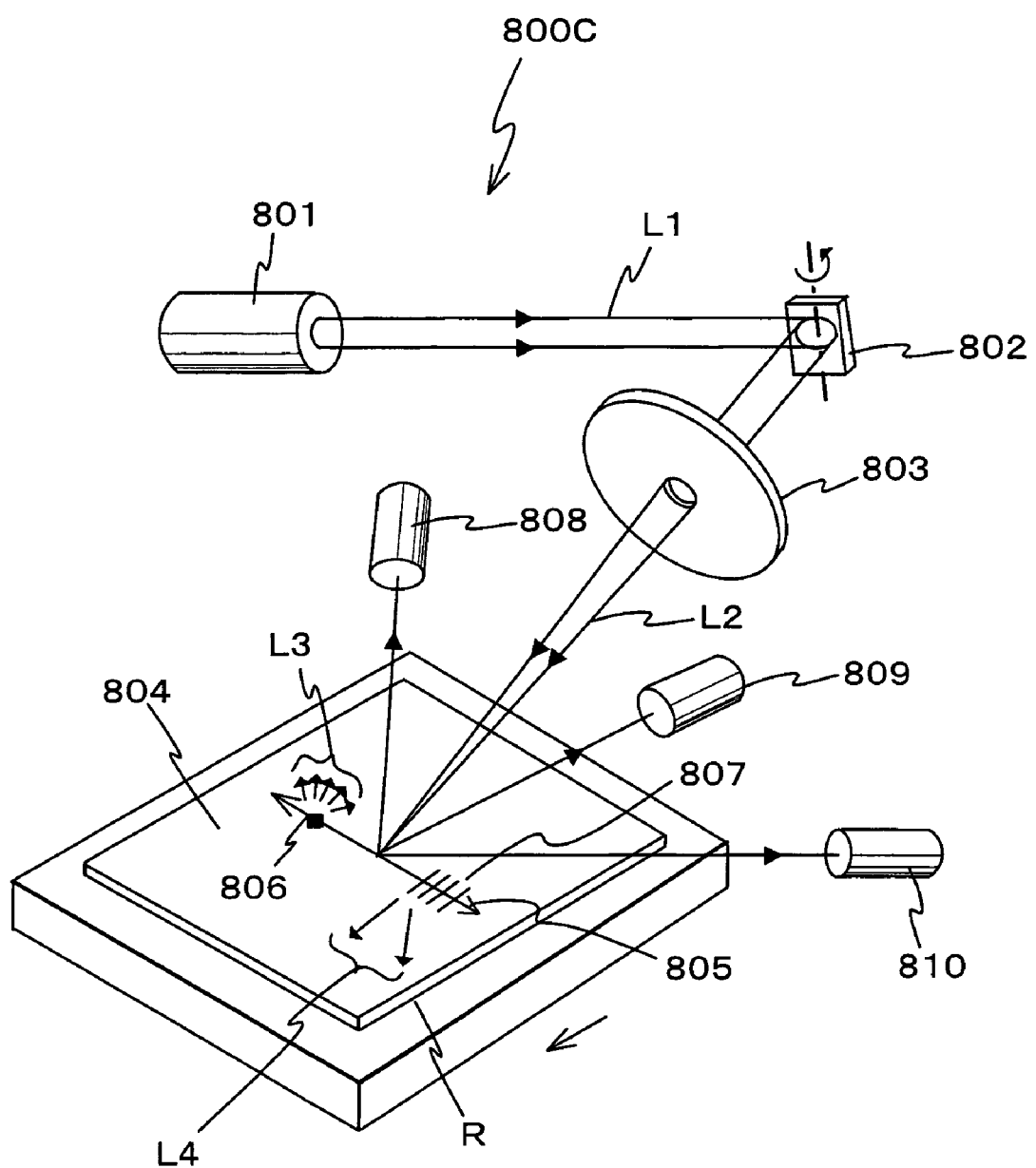
FIG. 17 is a view showing a schematic arrangement of a reticle measuring instrument related to a third embodiment of the present invention.
Figure 18:
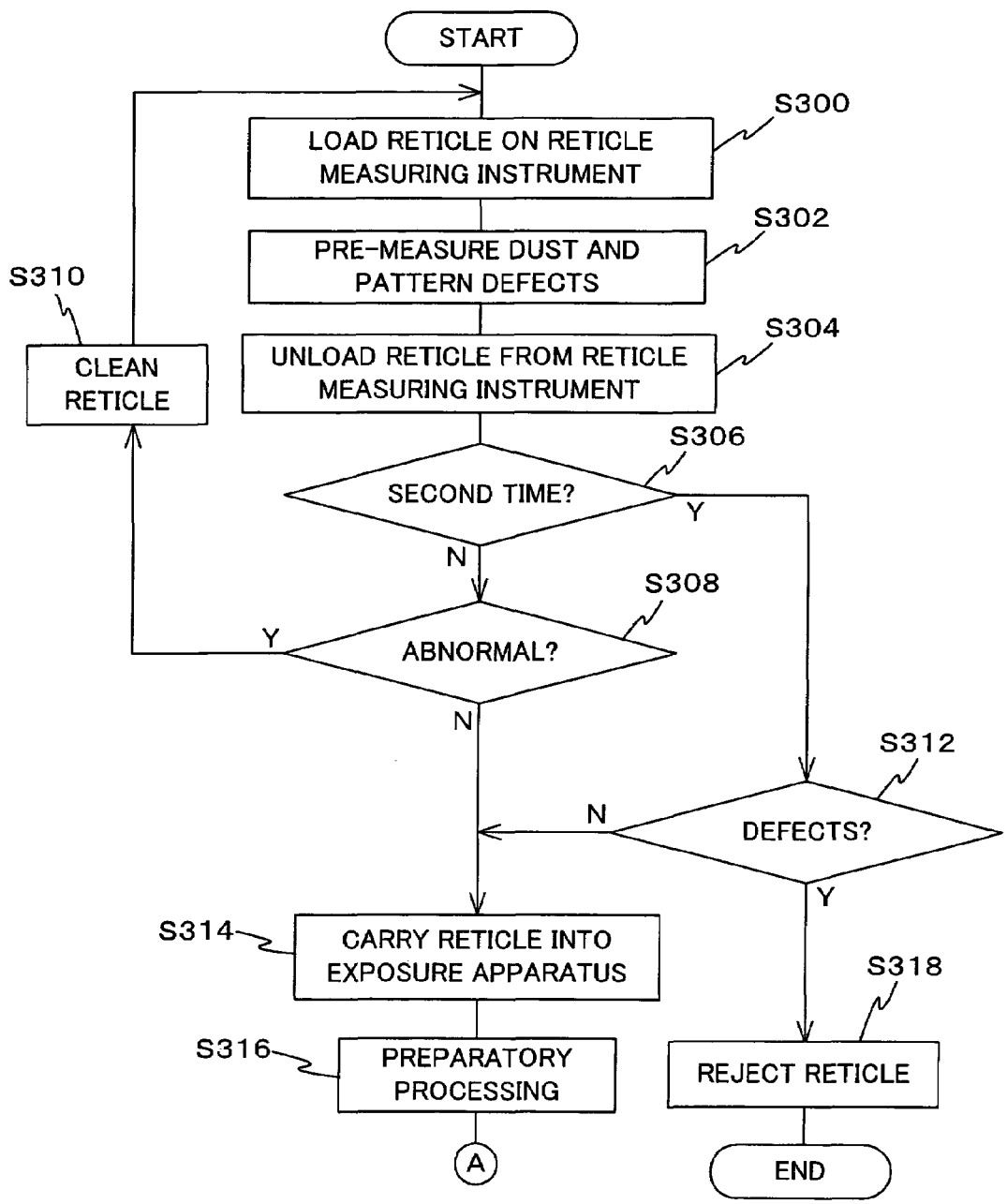
FIG. 18 is a flow chart showing a processing procedure when measuring the surface shape of a wafer related to the third embodiment of the present invention.

As is shown in FIG. 17, reticle measuring instrument 800C is configured including a light source 801, a vibration mirror 802, a scanning lens 803, and photodetectors 808, 809, and 810. Further on the pattern surface (inspection object surface 804) of reticle R, a circuit pattern is to be formed and a foreign material 806 is to be adhered on a part of the pattern surface.

Light beam L1 emitted from light source 801 is deflected by vibration mirror (a galvano-scanning mirror or a polygon scanning mirror) 802 and then enters scanning lens 803. From scanning lens 803, a light beam L2 is emitted, which scans scanning line 805 on inspection object surface 804. On the scanning, when inspection object surface 804 is moved in a direction orthogonal to scanning line 805 at a speed slower than the scan period of light beam L2, light beam L2 can scan the entire surface of inspection object surface 804. In this case, when light beam L2 is irradiated on the surface of inspection object surface 804 where foreign material 806 is adhered, a scattered light L3 is generated. Further, when light beam L2 is irradiated on an area where there is a periodic structure (hereinafter generally referred to as a 'pattern') 807 such as, for example, a circuit pattern on reticle R, a circuit pattern on wafer W, or the like, which is different from the foreign material adhered on inspection object surface 804 or a pattern defect, a diffracted light L4 is generated from pattern 807.

In FIG. 17, photodetectors 808, 809, and 810 are arranged facing scanning line 805 from different directions. Scattered light L3 generated from foreign material 806 is an isotropic scattered light that is generated in almost all directions, whereas diffracted light L4 generated from pattern 807 is light emitted in a spatially discrete direction (light with a strong directivity) because diffracted light L4 occurs due to diffraction. By using such difference in behavior of scattered light L3 and diffracted light L4, the judgment of can be made that when photodetectors 808, 809, and 810 all detect the light, then the light is a scattered light from a defect, and when there is a photodetector that does not detect the light, then the light is a diffracted light from the pattern. Accordingly, pattern 807 can be detected while being distinguished from foreign material 806.

Next, the operation of exposure system 200 related to the third embodiment will be described. FIG. 18 shows a flow chart that shows a processing procedure of pre-measuring the surface shape of reticle R in FIG. 17. As is shown in FIG. 18, in step S300, reticle R is loaded onto reticle measuring instrument 800C. Then, in step S302, the pattern surface of reticle R (adhesion of dust and pattern defects) is measured in the manner described above. The measurement results are sent to exposure process controlling controller 500. In the next step, step S304, reticle R is unloaded from reticle measuring instrument 800C.

In the next step, step S306, exposure process controlling controller 500 judges whether or not this measurement is the second measurement or not. When the judgment is affirmed, the step then moves to step S312, whereas when the judgment is denied, the step moves to step S308. In this case, since the measurement is the first measurement, the judgment is denied, therefore, the step moves to step S308. In step S308, scattered light L3 is observed during the measurement, and the judgment is made of whether or not a foreign material (for example, foreign material 806 in FIG. 17) is found on reticle R. When the judgment is denied, then the step moves to step S314, and when the judgment is affirmed, the step moves to step S310.

In step S310, a cleaning unit (not shown) cleans the pattern surface of reticle R (or cleaning of the pattern surface of reticle R is encouraged using the display functions on the monitor). After step S310 has been completed, the step then returns to step S300 where reticle R is loaded onto reticle measuring instrument 800C again. Then, in step S302, premeasuring of foreign materials and pattern defects is performed, and then in step S304, reticle R is unloaded from reticle measuring instrument 800C, and in step S306, the judgment is affirmed since this is the second measurement, therefore, the step moves to step S312.

Instep S312, the judgment is made of whether or not there is a defect on the pattern surface. When scattered light L3 is observed in the second measurement of reticle R even after the cleaning, it means that there is a pattern defect. Accordingly, in this case, when scattered light L3 is observed in the second measurement, the judgment is to be affirmed, and the step then moves to step S318. In step S318, reticle R is rejected (or rejection of reticle R is encouraged using the display functions on the monitor), and the processing is completed.

Meanwhile, after the judgment has been denied in step S308 (the case when scattered light L3 was not observed on reticle R in the first measurement) or after the judgment has been denied in step S312 (the case when scattered light L3 was not observed on reticle R in the second measurement), the step then moves to step S314. In step S314, reticle R is carried into exposure apparatus 100, and in step S316, preparatory processing similar to the one described in step S66 (refer to FIG. 8) in the first embodiment is performed. After performing step S316, processing similar to the ones shown in FIGS. 9 and 10 is performed.

As is described in detail so far, according to the third embodiment, before carrying reticle R used for exposure into exposure apparatus 100, the pattern surface of reticle R is measured, and information related to foreign materials adhered on reticle R and pattern defects is obtained. By this operation, foreign materials adhered on reticle R and pattern defects can be detected and dealt with at an early timing.

Further, according to the third embodiment, in the case scattered light L3 is observed when measuring the pattern surface of reticle R and the judgment is made that foreign materials are adhered on the pattern surface, the pattern surface of reticle R is cleaned in step S310. And then, in the case of performing the measurement described above again, and there still is scattered light L3 observed, the judgment is made of a pattern defect, therefore, it becomes possible to distinguish foreign materials on the pattern surface from pattern defects. Accordingly, it becomes possible to perform processing appropriately, depending on the detection results, such as in the case the judgment is made of confirming foreign materials, cleaning is performed, and when judgment is made of confirming pattern defects, reticle R is rejected.

In the third embodiment, the case has been described where the exposure system is equipped with reticle measuring instrument 800C that measures foreign materials and pattern defects on reticle R in advance, however, it is a matter of course that the exposure system can have a wafer measuring instrument that measures foreign materials and pattern defects on wafer W in advance. The arrangement and operation of the wafer measuring instrument can be substantially the same as the arrangement and operation of reticle measuring instrument 800C described above, therefore, a detailed description here will be omitted.

In the third embodiment as well, in the case the area of the pattern defect of reticle R is extremely small, then the remaining area can be used in exposure. For example, in the case a circuit pattern corresponding to a plurality of chip areas is formed in the pattern area of reticle R, exposure can be performed setting the reticle blind equipped in the illumination system (not shown) so that the chip area where there is a pattern defect is not exposed.

The same can also be said for wafer W, and in the case when there is a pattern defect on a part of the shot area on wafer W, if the pattern defect is limited to a part of the shot area, it is possible to exclude only the shot area containing the section where there is a pattern defect from the area subject to exposure.

In the first and second embodiments above, information related to the degree of flatness of reticle R and wafer W is the surface shape data of reticle R and wafer W, however, the present invention is not limited to this, and for example, the information can be differential data or integral data of the surface shape. Further, the information can be dispersion of the Z position of reticle R and wafer W, standard deviation, or the difference between the maximum value and the minimum value. Further, the surface shape data can be expressed in a surface shape map form of the Z position with respect to each x, y position, or in a function form.

In each of the embodiments above, reticle holder RH was held by suction at three surfaces, however, the present invention is not limited to this, and the reticle holder can be a four-point support reticle holder that supports the points in the vicinity of the four corners of reticle R.

In each of the embodiments above, reticle holders RH and RH' and wafer holders WH and WH' were holders based on vacuum chucking, however they may be holders by the electrostatic suction method. Further, on holding these holders RH, RH', WH, and WH', in order to prevent the position of reticle R and wafer W from shifting due to the acceleration generated when scanning the stages RST and WST, a mechanical clamp mechanism can also be used together for clamping reticle R and wafer W against reticle stage RST and wafer stage WST. In this case, on measuring the degree of flatness in advance, it is also desirable to create a state using such a clamp mechanism.

In each of the embodiments above, a Fizeau interferometer was used to measure the surface shape of reticle R and wafer W, however, the present invention is not limited to this. The measuring unit may be any unit as long as it measures the surface shape of reticle R and wafer W without coming into contact with the inspection object surface. For example, a measuring unit similar to the focal point position detection system (60a, 60b) equipped in exposure apparatus 100 can be used to measure the surface shape. When a detection system by the oblique incident method is used, it becomes possible to measure the surface shape with good precision, even if the reticle is a transparent reticle or the wafer is a wafer on which a complex circuit pattern is formed.

Further, in each of the embodiments above, reticle measuring instruments 800A and 800C were measuring instruments that were not in-line connected with exposure apparatus 100 (measuring instruments installed on the carrier path of the reticle), and wafer measuring instruments 400A and 400B were measuring instruments that were in-line connected with exposure apparatus 100 installed within track 300. By this arrangement, pre-measuring of the reticle and the wafer can be efficiently performed. However, the arrangement is not limited to this, and the arrangement can be reversed, or both instruments can be in-line connected or off-line connected to the exposure apparatus. Incidentally, reticle measuring instruments (or reticle inspecting instruments) 800A and 800C and wafer measuring instruments 400A and 400B (wafer inspecting instruments) can have the analysis function in analysis system 600, or can be made to give instructions (such as, for example, instructions to reject the wafer or the reticle as is previously described) according to the results of the analysis.

Further, in each of the embodiments above, as illumination light IL, any light can be used as long as it is generally used in an exposure apparatus. For example, the KrF excimer laser beam (wavelength: 248 nm), the ArF excimer laser beam (wavelength: 193 nm), the g-line (wavelength: 436 nm), the i-line (wavelength: 365 nm), the $F_2$ laser beam (wavelength: 157 nm), the copper vapor laser, the YAG laser, or harmonics such as the semiconductor laser can be used as illumination light IL.

Further, in each of the embodiments above, as the projection optical system, a reduction system, a system of equal magnification, or a magnifying system can be used, and the system can also be a refracting system, a catodioptric system, or a reflection system. In any optical system, as long as the image-forming characteristics can be adjusted in the optical system, then the exposure accuracy can be improved by adjusting the image-forming characteristics of the projection optical system as in each of the embodiments described above.

When building the exposure apparatus in each of the embodiments above, the projection optical system made up of a plurality of lenses is incorporated into the main body of the exposure apparatus. Then, optical adjustment operation is performed, as well as attaching the reticle stage and the wafer stage WST made up of multiple mechanical parts to the main body of the exposure apparatus, connecting the wiring and piping, and then, further performing total adjustment (such as electrical adjustment and operation check). In the first embodiment described above, before assembling reticle stage RST and wafer stage WST into the exposure apparatus, preparatory processing of computing the difference in the degree of flatness using datum reticle $R_T$ and the datum wafer has to be performed. Further, the exposure apparatus is preferably built in a clean room where conditions such as the temperature and the degree of cleanliness are controlled.

In each of the embodiments described above, the case has been described where the present invention is applied to a projection exposure apparatus based on a step-and-scan method. It is a matter of course, however, that the present invention can also be suitably applied to other exposure apparatus such as a projection exposure apparatus based on a step-and-repeat method or an exposure apparatus by a proximity method. Further, the present invention can also be suitably applied to a reduction projection exposure apparatus by a step-and-stitch method that merges shot areas together. Further, the present invention can also be applied to a twin stage type exposure apparatus that has two wafer stages. Further, the present invention can also naturally be applied to an exposure apparatus that employs an immersion method.

Further, the present invention is not limited to the exposure apparatus used for manufacturing semiconductor devices, and the present invention can be widely applied to an exposure apparatus for manufacturing displays including liquid crystal displays which transfers a device pattern onto a glass plate, and to an exposure apparatus for manufacturing thin-film magnetic heads which transfers a device pattern onto a ceramic wafer, and to an exposure apparatus for manufacturing imaging devices (such as CCDs), micromachines, organic ELs, DNA chips, and the like. Further, the present invention can also be applied to an exposure apparatus that uses an EUV light, an X-ray, or a charged particle beam such as an electron beam or an ion beam as illumination light IL.

Further, the present invention can also be suitably applied to an exposure apparatus that transfers a circuit pattern onto a glass substrate or a silicon wafer not only when producing microdevices such as semiconductors, but also when producing a reticle or a mask used in exposure apparatus such as an optical exposure apparatus, an EUV exposure apparatus, an X-ray exposure apparatus, and an electron beam exposure apparatus. Normally, in the exposure apparatus that uses DUV (deep (far) ultraviolet) light or VUV (vacuum ultraviolet) light, a transmittance type reticle is used, and as the reticle substrate, materials such as silica glass, fluorine-doped silica glass, fluorite, magnesium fluoride, or crystal are used. Further, in an X-ray exposure apparatus by the proximity method, or in an electron beam exposure apparatus, a transmittance type mask (a stencil mask, a membrane mask) is used, and as the mask substrate, silicon wafer or the like is used.

Further, in each of the embodiments above, the measurement results of the degree of flatness of reticle R and wafer W, foreign materials, and defects were sent to analysis system 600 where calculation is performed using the measurement results, and then exposure process controlling controller 500 controlled the process based on the measurement results and calculation results, however, the present invention is not limited to this. For example, analysis system 600 can control the process based on the measurement results and calculation results, or the measurement results of the degree of flatness of reticle R and wafer W, foreign materials, defects, and the like can be sent directly to main controller 20, and main controller 20 can perform calculation using the measurement results and control the process based on the calculation results.

Semiconductor devices are manufactured through the following steps: a step in which manufacturing and function designs are performed, a step in which a reticle is manufactured based on the design step, a step in which a wafer is made from silicon material, a step in which the pattern of the reticle is transferred onto wafer W by exposure system 200 and exposure apparatus 100 in each of the embodiments above, a memory repair step, a device assembly step (including the dicing process, bonding process, and packaging process), and an inspection step.

While the above-described embodiments of the present invention are the presently preferred embodiments thereof, those skilled in the art of lithography systems will readily recognize that numerous additions, modifications, and substitutions may be made to the above-described embodiments without departing from the spirit and scope thereof. It is intended that all such modifications, additions, and substitutions fall within the scope of the present invention, which is best defined by the claims appended below.

What is claimed is:

1. A measuring method, comprising:
    pre-obtaining, before carrying an object into an exposure apparatus that performs exposure using the object held by a predetermined holding unit, information related to a degree of flatness of the object in a state equivalent to a state held by the predetermined holding unit, wherein the pre-obtaining includes:
(a) measuring information related to the degree of flatness of the object in a state where the object is held by a first holding unit; and
(b) computing, based on a relation between information related to the degree of flatness of the object held by the first holding unit and information related to the degree of flatness of the object in a state held by a second holding unit in the exposure apparatus and on measurement results of information related to the degree of flatness of the object in a state held by the first holding unit, information related to the degree of flatness of the object in a state equivalent to a state held by the second holding unit,
wherein the predetermined holding unit is the second holding unit.

2. The measuring method according to claim 1, the measuring method further comprising, prior to the pre-obtaining:
calibrating, which comprises:
(a) measuring a degree of flatness of a datum object in a state held by the second holding unit;
(b) measuring a degree of flatness of the datum object in a state held by the first holding unit; and
(c) computing a difference between measurement results of the degrees of flatness obtained in (a) and (b) of the calibrating.

3. The measuring method according to claim 2 wherein a plurality of second holding units are prepared, the measuring method further comprising:
selecting a second holding unit whose degree of flatness of the object is most favorable from the plurality of second holding units, as the second holding unit that holds the object in the exposure apparatus, based on the difference.

4. The measuring method according to claim 2 wherein in the calibrating,
the information related to the degree of flatness of the object is measured while performing adjustment of a holding state of the object in the second holding unit, and results of the adjustment are taken into consideration when the object is held by the second holding unit inside the exposure apparatus.

5. The measuring method according to claim 4 wherein in the calibrating,
an optimal holding position of the object by the second holding unit is obtained, based on a degree of change in the information related to the degree of flatness of the object due to a change in at least one of holding force, holding position, and holding surface of the object by the second holding unit.

6. The measuring method according to claim 2, the measuring method further comprising:
detecting an abnormal degree of flatness, based on results obtained in the calibrating; and
exchanging the second holding unit in a case that the abnormal degree of flatness is detected.

7. The measuring method according to claim 1, the measuring method further comprising:
detecting an abnormal degree of flatness, based on results obtained in the pre-obtaining; and
performing at least one of excluding the object and cleaning a holding surface of the holding unit holding the object in a case that the abnormal degree of flatness is detected.

8. An exposure method in which a pattern formed on a mask is transferred onto a photosensitive object via a projection optical system, the exposure method comprising:
measuring information related to the degree of flatness of at least one of the mask and the photosensitive object, using the measuring method according to claim 1; and
transferring the pattern onto the photosensitive object while performing at least one of correcting the image-forming characteristics of the projection optical system and correcting the relative position between the mask and the photosensitive object, based on results of the measurement.

9. The exposure method according to claim 8 wherein
in the measuring, the degree of flatness of both the mask and the photosensitive object is measured and a difference between the degree of flatness of the mask and the degree of flatness of the photosensitive object is obtained, and
in the transferring, at least one of correcting the image-forming characteristics of the projection optical system and correcting the relative position between the mask and the photosensitive object is performed, taking into consideration the difference between the degree of flatness of the mask and the degree of flatness of the photosensitive object.

10. The exposure method according to claim 8 wherein
in the measuring, in a case of measuring the degree of flatness of the mask, the image-forming characteristics of the projection optical system includes at least one of focus, curvature of field, and distortion of the projection optical system.

11. The exposure method according to claim 8 wherein
in the measuring, in a case of measuring the degree of flatness of the photosensitive object, the image-forming characteristics of the projection optical system includes focus of the projection optical system.

12. The exposure method according to claim 8 wherein
in a case of performing the measuring and the transferring sequentially on each of a plurality of photosensitive objects, the measuring is performed on a photosensitive object that will be processed next, while the transferring is being performed on a preceding photosensitive object.

13. An exposure method in which exposure is performed using an object held by a predetermined holding unit, the exposure method comprising:
adjusting a holding state of the object, based on a measurement of a degree of flatness of the object in a state held by a first holding unit so that the degree of flatness of the object in a state held by a second holding unit is favorable; and
performing exposure while the object is held by the second holding unit in the adjusted holding state,
wherein the predetermined holding unit is the second holding unit.

14. An exposure system, comprising:
a pre-obtaining unit that, before carrying an object into an exposure apparatus that performs exposure using the object held by a predetermined holding unit, obtains information related to a degree of flatness of the object in a state equivalent to a state held by the predetermined holding unit; and the exposure apparatus that performs exposure using the object held by a second holding unit, wherein
the pre-obtaining unit includes
a measuring unit that measures information related to the degree of flatness of the object in a state where the object is held by a first holding unit; and a computation unit that, based on a relation between information related to the degree of flatness of the object held by the first holding unit and information related to the degree of flatness of the object in a state held by the second holding unit in the exposure apparatus and on measurement results of information related to the degree of flatness of the object in a state held by the first holding unit, computes information related to the degree of flatness of the object in a state equivalent to a state held by the second holding unit, wherein the predetermined holding unit is the second holding unit.

15. The exposure system according to claim 14, further comprising:

a calibration unit that, prior to processing by the pre-obtaining unit, measures a degree of flatness of a datum object in a state held by the second holding unit, measures a degree of flatness of the datum object in a state held by the first holding unit, and computes a difference between measurement results of both the degrees of flatness that have been obtained.

16. The exposure system according to claim 15 wherein the calibration unit measures information related to the degree of flatness of the object while performing adjustment of a holding state of the object in the second holding unit, and the exposure apparatus further comprises an adjustment unit that adjusts the holding state of the object in the second holding unit taking into consideration results of adjustment by the calibration unit.

17. The exposure system according to claim 16 wherein the calibration unit obtains an optimal holding position of the object by the second holding unit as a result of the adjustment, based on a degree of change in the degree of flatness of the object due to a change in at least one of holding force, holding position, and holding surface of the object by the second holding unit.

18. The exposure system according to claim 15, the system further comprising:

a detection unit that detects an abnormal degree of flatness, based on results obtained by the calibration unit; and a processing unit that performs at least one of exchanging the second holding unit, excluding the object, and cleaning a holding surface of the second holding unit holding the object in a case that the abnormal degree of flatness is detected.

19. The exposure system according to claim 14 wherein the pre-obtaining unit is a measuring unit by a non-contact detection method that measures information related to the degree of flatness of the object.

20. The exposure system according to claim 19 wherein the measuring unit is a Fizeau interferometer.

21. The exposure system according to claim 20 wherein the Fizeau interferometer is a double-path type interferometer.

22. The exposure system according to claim 14 wherein the exposure apparatus is a projection exposure apparatus that transfers a pattern formed on a mask onto a photosensitive object via a projection optical system, whereby the pre-obtaining unit obtains information related to the degree of flatness of at least one of the mask and the photosensitive object, and the exposure apparatus performs exposure while performing at least one of correcting the image-forming characteristics of the projection optical system and correcting the relative position between the mask and the photosensitive object, based on results of the obtaining.

23. The exposure system according to claim 22 wherein the pre-obtaining unit measures the degree of flatness of both the mask and the photosensitive object and further obtains a difference between the degree of flatness of the mask and the degree of flatness of the photosensitive object based on measurement results, and the exposure apparatus performs at least one of correcting the image-forming characteristics of the projection optical system and correcting the relative position between the mask and the photosensitive object, taking into consideration the difference between the degree of flatness of the mask and the degree of flatness of the photosensitive object.

24. The exposure system according to claim 22, the system comprising:

a pre-obtaining unit that measures information related to the degree of flatness of the mask; and a pre-obtaining unit that measures information related to the degree of flatness of the photosensitive object, wherein the pre-obtaining unit that measures information related to the degree of flatness of the photosensitive object is in-line connected with the exposure apparatus, and the pre-obtaining unit that measures information related to the degree of flatness of the mask is installed on a carrier path where the mask is carried.

25. A measuring system in which before carrying an object into an exposure apparatus that performs exposure using the object held by a predetermined holding unit, information related to a degree of flatness of the object in a state equivalent to a state held by the predetermined holding unit is obtained, the measuring system comprising:

a pre-obtaining unit that obtains information related to the degree of flatness of the object in a state held by a first holding unit;

a computation unit that, based on information related to the degree of flatness of the object that has been obtained and on a relation between information related to the degree of flatness of the object in a state held by the first holding unit and information related to the degree of flatness of the object in a state held by a second holding unit in the exposure apparatus, computes information related to the degree of flatness of the object in a state equivalent to a state held by the second holding unit;

wherein the predetermined holding unit is the second holding unit.

26. The measuring system according to claim 25, the system further comprising:

a storage unit that stores a difference between information related to both the degrees of flatness serving as the relation, which is obtained by measuring information related to a degree of flatness of a datum object in a state held by the second holding unit and information related to a degree of flatness of the datum object in a state held by the first holding unit and subtracting the measurement results, prior to obtaining information related to the degree of flatness of the object.

27. The measuring system according to claim 26 wherein in a case where a plurality of second holding units are prepared, the measuring system further comprises:

a selection unit that selects from the plurality of second holding units, a second holding unit whose degree of flatness of the object is most favorable as the second holding unit that holds the object, based on the difference.

28. The measuring system according to claim 25 wherein the measuring unit directly measures information related to the degree of flatness of the object in a state held by the second holding unit.

29. The measuring system according to claim 28 wherein the measuring unit measures information related to the degree of flatness of the object while performing adjustment of a holding state of the object in the second holding unit.

30. The measuring system according to claim 29, the system further comprising:

a calculation unit that obtains an optimal holding position of the object by the second holding unit, based on a degree of change in the degree of flatness of the object due to a change in at least one of holding force, holding position, and holding surface of the object by the second holding unit.

31. The measuring system according to claim 28, the system further comprising:

a detection unit that detects an abnormal degree of flatness of the object, based on information related to the degree of flatness of the object computed by the computation unit; and in a case that the abnormal degree of flatness is detected, exchange of the second holding unit is encouraged.

32. The measuring system according to claim 25, the system further comprising:

a detection unit that detects an abnormal degree of flatness, based on information related to the degree of flatness of the object computed by the computation unit; and in a case that the abnormal degree of flatness is detected, at least one of excluding the object and cleaning a holding surface of the holding unit holding the object is encouraged.

* * * * *

UNITED STATES PATENT AND TRADEMARK OFFICE
CERTIFICATE OF CORRECTION

PATENT NO. : 7,593,100 B2
APPLICATION NO. : 11/336761
DATED : September 22, 2009
INVENTOR(S) : Shinichi Okita Page 1 of 1

It is certified that error appears in the above-identified patent and that said Letters Patent is hereby corrected as shown below:

On the title page, item (75) Inventor:
  change: "Shinichi Okita, Hishi Tokyo (JP)"
  to: --Shinichi Okita, Tokyo (JP)--

Signed and Sealed this

Twenty-second Day of December, 2009

David J. Kappos
*Director of the United States Patent and Trademark Office*

UNITED STATES PATENT AND TRADEMARK OFFICE
CERTIFICATE OF CORRECTION

PATENT NO.       : 7,593,100 B2                      Page 1 of 1
APPLICATION NO. : 11/336761
DATED            : September 22, 2009
INVENTOR(S)      : Shinichi Okita It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 586 days.

Signed and Sealed this

Twenty-first Day of September, 2010

David J. Kappos
*Director of the United States Patent and Trademark Office*